(12) United States Patent
Chang

(10) Patent No.: US 8,656,244 B1
(45) Date of Patent: Feb. 18, 2014

(54) RATE ADAPTIVE NONBINARY LDPC CODES WITH LOW ENCODING COMPLEXITY

(75) Inventor: Nicholas B. Chang, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 209 days.

(21) Appl. No.: 13/284,349

(22) Filed: Oct. 28, 2011

Related U.S. Application Data

(60) Provisional application No. 61/408,204, filed on Oct. 29, 2010, provisional application No. 61/408,209, filed on Oct. 29, 2010.

(51) Int. Cl.
*H03M 13/00* (2006.01)

(52) U.S. Cl.
USPC .......................................... 714/752; 714/758

(58) Field of Classification Search
USPC ......................................... 714/752, 755, 758
See application file for complete search history.

(56) References Cited

U.S. PATENT DOCUMENTS

| | | | |
|---|---|---|---|
| 6,715,121 | B1 | 3/2004 | Laurent |
| 7,219,288 | B2 | 5/2007 | Dielissen et al. |
| 7,668,248 | B2 | 2/2010 | Hocevar |
| 2006/0156167 | A1 | 7/2006 | Dielissen et al. |
| 2009/0259915 | A1* | 10/2009 | Livshitz et al. ............... 714/758 |
| 2009/0287981 | A1* | 11/2009 | Kimura et al. ............... 714/752 |
| 2010/0050043 | A1 | 2/2010 | Savin |
| 2010/0064199 | A1* | 3/2010 | Branco et al. ............... 714/758 |
| 2010/0107031 | A1 | 4/2010 | Kimura et al. |
| 2010/0169736 | A1 | 7/2010 | Garani |
| 2010/0211847 | A1 | 8/2010 | Livshitz et al. |

OTHER PUBLICATIONS

Bosco et al. non-binary low density parity check codes for satellite communication, 2006, IEEE computer and communication, proceedings 11th. pp. 1-6.*
Kimura et al., Construcyion pf parity check matrices for non-binary LDPC, Apr. 2006,IEEE Turbo-coding, pp. 1-4.*
Capirone, et al.; "Nonbinary decoding of structured LDPC codes;" Information Theory; IEEE International Symposium; Jul. 6-11, 2008; pp. 950-954.
Chang, et al.; "Performance and Complexity Tradeoffs of Space-Time Modulation and Coding Schemes;" Proceedings of the 43$^{rd}$ Asilomar Conference on Signals, Systems, and Computers; 2009; pages; pp. 1-5.
Cunche, et al.; "Analysis of Quasi-Cyclic LDPC codes under ML decoding over the erasure channel;" IEEE International Symposium on Information Theory and its Applications (ISITA, 2010); Jul. 2010; pp. 1-6.

(Continued)

*Primary Examiner* — Sam Rizk
(74) *Attorney, Agent, or Firm* — Daly, Crowley, Mofford & Durkee, LLP

(57) ABSTRACT

Described herein is a method and system that provides a class of error correction codes which can be used in communication systems to correct errors which may be introduced by a communication channel. In particular, a "staircase matrix" or "staircase LDPC code" is defined that enables performance gains associated with nonbinary LDPC codes while requiring low encoding complexity. Also, the concepts, systems and techniques described herein allow for implementation of a single encoder and decoder structure which can realize arbitrary rational coding rates, thus enabling a communication system to easily adapt a coding rate to different coding requirements.

26 Claims, 14 Drawing Sheets

(56) References Cited

OTHER PUBLICATIONS

Cagliari; "Non-Binary Low Density Parity Check Codes for Satellite Communications;" 11$^{th}$ IEEE Symposium on Computers and Communications (ISCC'06); Jun. 26-29, 2006 (Abstract only).

Roca, et al.; "Low Density Parity Check (LDPC) Staircase and Triangle Forward Error Correction (FEC) Schemes;" Network Working Group; STMicroelectronics; Jun. 2008; pp. 1-34.

Siegel; "An Introduction to Low-Density Parity-Check Codes;" Center for Wireless Communications; CMRR; May 31, 2007; pp. 1-145.

Guo, et al.; "Low Complexity Non-Binary LDPC and Modulation Schemes Communicating over MIMO Channels;" School of ECS, Univ. of Southampton, UK, IEEE, Jul. 2004; pp. 1294-1298.

Margetts, et al.; "Direct Space-Time Gf($q$) LDPC Modulation;" IEEE, Jan. 2006, pp. 1264-1268.

Peng, et al.; "Application of Nonbinary LDPC Cycle Codes to MIMO Channels;" IEEE, Jun. 2008, pp. 2020-2026.

* cited by examiner $$H = \begin{bmatrix} W_{1,1} & W_{1,2} & \cdots & W_{1,k} \\ W_{2,1} & W_{2,2} & \cdots & W_{2,k} \\ W_{3,1} & W_{3,2} & \cdots & W_{3,k} \\ \vdots & \vdots & & \vdots \\ W_{n-k,1} & W_{n-k,2} & \cdots & W_{n-k,k} \end{bmatrix} \begin{bmatrix} \alpha_1 & 0 & \cdots & & 0 \\ \beta_2 & \alpha_2 & 0 & & \vdots \\ 0 & \beta_3 & \alpha_3 & & \\ \vdots & & \ddots & \ddots & 0 \\ & & & \beta_{n-k} & \alpha_{n-k} \end{bmatrix}$$

$\underbrace{\phantom{W = \text{sparse random}}}_{\substack{W = \text{sparse random} \\ 302}}$ $\underbrace{\phantom{V = \text{staircase}}}_{\substack{V = \text{staircase} \\ 304}}$

FIG. 3

$$H = \begin{bmatrix} W_{1,1} & W_{1,2} & \cdots & W_{1,k} \\ W_{2,1} & W_{2,2} & \cdots & W_{2,k} \\ W_{3,1} & W_{3,2} & \cdots & W_{3,k} \\ \vdots & \vdots & & \vdots \\ W_{n-k,1} & W_{n-k,2} & \cdots & W_{n-k,k} \end{bmatrix} \begin{bmatrix} \alpha_1 & 0 & \cdots & & 0 \\ \beta_2 & \alpha_2 & 0 & & \vdots \\ 0 & \beta_3 & \alpha_3 & & \\ \vdots & & \ddots & \ddots & 0 \\ & & & \beta_{n-k} & \alpha_{n-k} \end{bmatrix} \cdot \begin{bmatrix} S_{1,1} \cdots S_A & P_1 \cdots P_{n-k} \end{bmatrix} = 0$$

RATE ADAPTIVE NONBINARY LDPC CODES WITH LOW ENCODING COMPLEXITY

CROSS REFERENCE TO RELATED APPLICATIONS

This application claims priority to provisional application Ser. No. 61/408,204, entitled "NONBINARY STAIRCASE LDPC CODES WITH LOW ENCODING COMPLEXITY," filed Oct. 29, 2010 and also to provisional application Ser. No. 61/408,209, entitled "RATE ADAPTIVE NONBINARY LDPC CODES WITH LOW ENCODING COMPLEXITY," filed Oct. 29, 2010, both applications are hereby incorporated herein by reference in their entireties.

STATEMENT REGARDING FEDERALLY SPONSORED RESEARCH

This invention was made with Government support by the Department of Defense under Air Force Contract No. FA 8721-05-C-0002, Program No. 1338-91. The Government has certain rights in the invention.

BACKGROUND

As is known in the art, a code is a rule for converting a piece of original information (for example, a letter, word, phrase, or other information) into another form or representation which may or may not necessarily be of the same type as the original information.

In the fields of communications and information processing, encoding and modulation is a process by which information from a source is converted into symbols to be communicated (e.g. transmitted via a transmitter). Decoding and demodulation is the reverse process, converting these code symbols back into information understandable by a receiver.

As is also known, an encoder is a device, circuit, process, processor, processing system or other system that converts information from one format or code to another. The process of encoding is often done for the purposes of reliability, error correction, standardization, speed, secrecy, security, and/or saving space.

As is also known, emerging technology and increasing demand for large-scale high-speed data communications have made it important for systems to achieve efficient and reliable digital data transmission. Strong error correction codes are necessary to fix errors introduced by noise and multipath fading in communication channels. For communication systems employing a single-transmitter, it is well known that turbo codes and low-density parity-check (LDPC) codes perform near Shannon capacity limits and that LDPC codes over binary field extensions outperform their binary counterparts.

Additionally, error correction coding is important for robust multiple-input multiple-output (MIMO) wireless communication systems. The use of multiple antennas increases system capacity and reliability when information symbols are appropriately coded and modulated across the multiple transmit antennas. Space-time modulation and coding research is a rich field covering areas such as orthogonal block codes, trellis codes, lattice codes, threaded codes, and algebraic codes. Recent works have also proposed using a non-binary Galois-field of size q [GF(q)] LDPC code in combination with a direct space-time modulation scheme. Their results show that for quasi-static channels of up to four transmit antennas, this coding and modulation combination performs within 0.5 dB of outage probability and 0.8 dB better than space-time bit-interleaved coded modulation with iterative detection (BICM-ID).

The appropriate coding rate to use for a system is dependent upon the communication channel. Time varying fading in the wireless channel between the transmitter and receiver antennas means that the maximum achievable data rate will change as the channel conditions vary or nodes are placed in different environments. Thus, a scheme is needed which effectively adapts data rate to the channel. Emerging wireless standards such as WiMAX, 802.11n, and Long Term Evolution (LTE) have proposed using different data rates to adapt to varying channel conditions. The number of different rates in such proposals, however, is limited because either different codes are needed for each rate or determining the rate adaptation scheme on a code for a given rate may not be easy. In addition, such schemes generally propose suboptimal rate adaptation techniques which result in performance loss as the rate is varied.

SUMMARY

Since strong error correction codes are needed by communication systems to achieve efficient and reliable digital data transmission, described herein are systems and techniques which provide a class of error correction codes which can be used in communication systems to correct errors which may be introduced by the communication channel. For example, some applications of the techniques described herein include, but are not limited to, wireless communications systems and systems employing multiple-input multiple-output (MIMO) antenna technology.

In one aspect, techniques provide a class of error correction codes which may have one or more (or all) of the following properties:

(1) codes may utilize nonbinary low density parity check (LDPC) codes defined over higher-order Galois fields of size q, GF(q), to achieve performance near system capacity with high reliability;
(2) the code structure generally requires low encoding complexity, with the number of operations scaling linearly with the codeword length;
(3) the code structure allows for sequential encoding implementations that enables applications such as real-time encoding;
(4) the codes can be applied to design strong space-time codes for multiple-input multiple-output (MIMO) antenna communication systems; and
(5) the codes allow for a flexible rate adaptive implementation which can use a single encoding structure to realize a variety of coding rates by varying the number of information symbols, parity symbols, or both Advantageously, the systems and techniques described herein enable performance gain associated with nonbinary LDPC codes while requiring low encoding complexity.

While some conventional systems and techniques use binary LDPC codes which have performance loss compared to nonbinary codes and other conventional systems and techniques use nonbinary LDPC codes, these conventional systems all require relatively high encoding complexity or non-sequential encoding.

In contrast, the systems and techniques described herein achieve high performance associated with nonbinary LDPC codes while requiring low encoding complexity that can also be implemented in a sequential manner.

In another aspect, a method for generating a set of coded symbols may comprise (a) providing a parity check matrix H which includes a first portion corresponding to a sparse matrix and a second portion corresponding to a staircase matrix; (b) applying the parity check matrix H to a first set of k information symbols $s_1$-$s_k$ to generate an intermediate value by forming a vector dot product between elements in a first row of the parity check matrix H and a first set of k information symbols $s_1$-$s_k$ and wherein the first intermediate value corresponds to a first intermediate parity check symbol $\tilde{p}_1$; and (c) computing a second parity check symbol $\tilde{p}_2$ by applying the parity check matrix H to a first set of information symbols to generate an intermediate value by forming a vector dot product between elements in a second row of the parity check matrix H and a first set of k information symbols $s_1$-$s_k$ and summing a value corresponding to the product of the first intermediate parity check symbol $\tilde{p}_1$ and a corresponding non-diagonal coefficient of the staircase portion of the parity check matrix H.

In addition, according to an embodiment herein, this method may further comprise (d) determining remaining intermediate parity symbols $\tilde{p}_i$ by applying the parity check matrix H to a first set of information symbols to generate an intermediate value by forming a vector dot product between elements in a i th row of the parity check matrix and a first set of k information symbols $s_1$-$s_k$ and summing a value corresponding to the product of the previous intermediate parity check symbol $\tilde{p}_{i-1}$ and a corresponding non-diagonal coefficient of the staircase portion of the parity check matrix.

In still another embodiment, the method above may sum the value corresponding to the product of the first intermediate parity check symbol $\tilde{p}_1$ and a corresponding non-diagonal coefficient of the staircase portion of the parity check matrix H by specifically summing a value corresponding to the product of the first intermediate parity check symbol $\tilde{p}_1$ and a corresponding ratio between the non-diagonal coefficient and a diagonal coefficient of the staircase portion of the parity check matrix H.

In other aspects, another method may comprise (a) determining a plurality of intermediate parity symbols $\tilde{p}_1 \rightarrow \tilde{p}_{n-k}$; (b) determining a final parity check value $p_{n-k}$ by multiplying the intermediate parity symbol $\tilde{p}_{n-k}$ by a value computed from parity check matrix coefficients of a staircase portion of a parity check matrix having a sparse portion and a staircase portion wherein the value corresponds to a ratio of the off-diagonal coefficient to the diagonal coefficient of the staircase portion of the parity check matrix; and (c) determining remaining parity symbols by computing a sum of the intermediate parity symbols $\tilde{p}_i$ and a value computed as the product of the final parity check value $p_{n-k}$ and the ratio of the off-diagonal coefficient to the diagonal coefficient.

In further aspects, still another method may comprise (a) providing a parity check matrix H which includes a first portion corresponding to a sparse matrix and a second portion corresponding to a staircase matrix; and (b) applying the parity check matrix H to a first set of k information symbols $s_1$-$s_k$ to generate a first parity check symbol $p_1$.

Additionally, in one embodiment, this method may further comprise (c) determining remaining parity symbols $\tilde{p}_i$ by applying the parity check matrix H to a first set of information symbols to generate an intermediate value by forming a vector dot product between elements in a i th row of the parity check matrix and a first set of k information symbols $s_1$-$s_k$ and summing a value corresponding to the product of the previous parity check symbol $p_{i-1}$ and a corresponding non-diagonal coefficient of the staircase portion of the parity check matrix.

Also, in another embodiment of this method, the sparse matrix portion of the parity check matrix H corresponds to a left hand portion of the parity check matrix H and the staircase matrix portion of the parity check matrix H corresponds to a right hand portion of the parity check matrix H.

In still further aspects, a system for transmitting information bits may comprise a transmitter comprising a low density parity check (LDPC) encoder configured to receive information bits and to apply an LDPC code provided from a parity check matrix H which includes a first portion corresponding to a sparse matrix and a second portion corresponding to a staircase matrix to provide a set of coded symbols.

In one example, this system may further comprise a modulator coupled to receive coded symbols from said encoder and to provide modulated coded symbols for transmission via one or more antenna.

In another example, the modulator is provided as a space-time modulator coupled to receive coded symbols from said encoder and to provide space-time modulated coded symbols for transmission via a plurality of antenna.

In further examples, a method for transmitting information bits may comprise (a) generating a set of coded symbols via an encoder configured to receive the information bits and apply an LDPC code provided from a parity check matrix H which includes a first portion corresponding to a sparse matrix and a second portion corresponding to a staircase matrix to provide a set of coded symbols; and (b) transmitting the set of coded symbols.

Advantageously, the techniques herein use a single encoding structure that can realize different coding rates while attaining the performance gain associated with nonbinary LDPC codes and requiring low encoding complexity. Specifically, some existing methods require multiple encoding or decoding structures for achieving different coding rates. Other existing methods utilize a single encoding structure to realize multiple coding rates but suffer performance degradation due to either inefficient coding structure, weaker error correction code (e.g. binary LDPC code), or higher encoding complexity requirements for each rate. By contrast, the techniques herein combine the following aspects: single encoding/decoding structure, high performance at arbitrary rational coding rate, low encoding complexity, and sequential encoder implementation.

Also described are rate adaptive systems including rate adaptive receiving systems. The rate adaptive coding scheme described herein can maintain constant codeword (frame) length for different code rates and can thus be easily combined with other techniques including, but not limited to, orthogonal frequency division multiplexing (OFDM), which may require a constant codeword length. More generally, the technique described herein can also be used generate variable-length codewords that vary in both the number of information symbols and/or the number of parity symbols.

One exemplary decoding procedure for the rate adaptive staircase codes is to use a single parity check matrix for all rates. In this exemplary embodiment all probabilities are computed for all codeword symbols generated during an encoding process. Uniform probabilities are inserted in locations where zeros were inserted during a zero padding process. Uniform probabilities are also inserted in the symbol removal locations used by a symbol removal processor. Adding the symbol and uniform probabilities provides a resultant collection of probabilities which are provided as an input an LDPC decoder using the primary staircase matrix.

Alternatively, another rate adaptive decoding approach is to use different parity check matrices for different coding rates. In this approach, the symbol probabilities are first computed. The probabilities are then input to an LDPC decoder which uses the parity check matrix $\tilde{H}=[\tilde{W}|\hat{V}]$ described in Theorem 1 for the given rate

BRIEF DESCRIPTION OF THE DRAWINGS

FIGS. 3 and 3A are exemplary GF(q) LDPC staircase parity check matrices.

DETAILED DESCRIPTION

Strong error correction codes are needed by communication systems to achieve efficient and reliable digital data transmission over a noisy channel. As described herein, a low density parity check (LDPC) coding scheme is defined over higher order Galois fields (GF) which uses a low complexity encoding structure but maintains strong performance. The complexity of the encoder scales linearly with the codeword length. Additionally, the encoding structure enables a sequential implementation. Particularly, the techniques described below illustrate how the code can be combined with a direct modulation approach to produce a strong space-time coding scheme for multiple-input multiple-output (MIMO) communications systems. The resulting space-time code achieves near capacity performance for different MIMO system configurations under flat fading and block fading channels.

Figure 1:
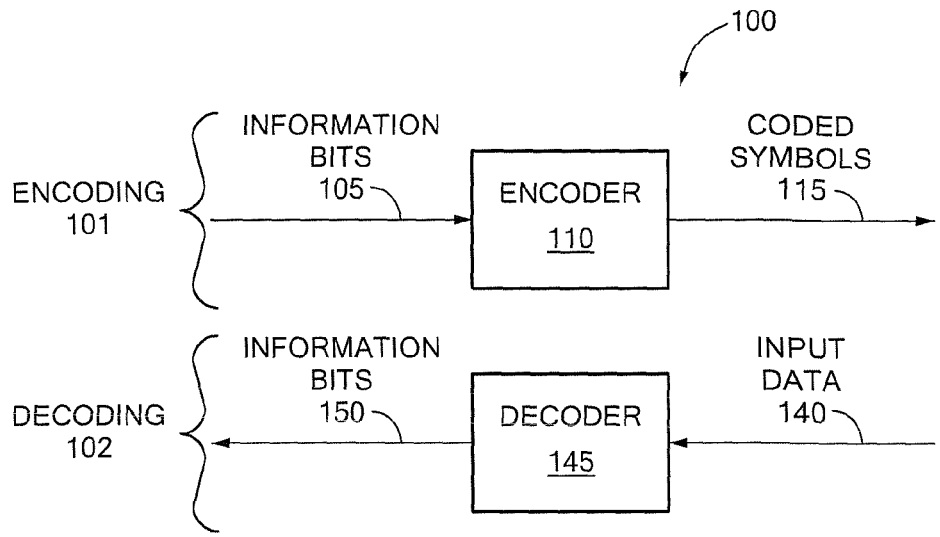
FIG. 1 is a block diagram of an example encoding and decoding system.

FIG. 1 illustrates a block diagram of an example system 100 that may be used in accordance with the embodiments herein, e.g., to encode and decode information. In particular, the system 100 may comprise an encoding portion 101 and/or decoding portion 102. The encoding portion may receive information bits 105 at an encoder 110, which may encode the information as described herein, and the coded symbols 115 may be transmitted out of the encoder, accordingly. Conversely, the decoding portion 102 may receive input data (e.g., a noisy or probabilistic representation of coded signals) 140 at a decoder 145, which may generate decoded information bits 150. Illustratively, the encoder and/or decoder may be embodied as hardware, software, firmware, or any combination thereof. For instance, one or more memories and processors may be configured to store and execute, respectively, various software programs or modules to perform the various functions encoding and/or decoding techniques described herein. For example, in certain embodiments, the coding system may be implemented in a field-programmable gate array (FPGA), and may be capable of achieving successful communication for high data rates. Alternatively, coding system may be implemented via an application specific integrated circuit (ASIC) or a digital signal processor (DSP) circuit or via another type of processor or processing device or system.

Illustratively, LDPC codes may be considered over nonbinary field extensions (higher-order fields), which are generally known to outperform their binary counterparts. For example, according to known techniques, code design for LDPC codes over a Galois field of size q, denoted GF(q), may be simple and yield superb results. Particularly, parity-check matrices are constructed in two steps. First, a random, regular, binary parity-check matrix is constructed with no cycles that are shorter than some desired length. Second, the nonzeros of the binary parity-check matrix are replaced with nonzero elements of GF(q) which can be chosen randomly or determined so that coefficients on cycles satisfy certain conditions. Those skilled in the art will appreciate that through a theoretical framework studying the nonzero coefficients of a nonbinary sparse parity check matrix, it may be shown that as the Galois field size and codeword length both increase, the Hamming weight spectra of matrices comprising of random nonzero locations and random nonzero coefficients approaches that of the classical binomial distribution of the Shannon equiprobable random ensemble.

The GF(q) LDPC code performance for q>2 is typically very sensitive to the number of nonzero elements per column, i.e., the column weight $\rho_c$. As may be understood by those skilled in the art, for a 2×1 quasi-static channel and using large Galois Field sizes, near optimal performance is achieved when $\rho_c=2$, which is the minimum column weight for a code symbol to be dependent on two or more check symbols. This conclusion may also be supported for larger numbers of transmit and receive antenna, such that, as described herein, a 4×4 and 2×2 system may both use parity-check matrices with column weight of $\rho_c=2$. Similarly, maintaining constant row weights is also preferred. Further, the techniques described herein work for arbitrary positive values of $\rho_c$ and do not require constant row weights.

Notably, in addition to the random placement of nonzero locations in the parity check matrix, there exist other methods of constructing parity check matrices, e.g. EXIT chart analysis and the use of binary images, as may be appreciated by those skilled in the art. Again, the techniques described herein work for arbitrary positive values of $\rho_c$ and do not require constant row weights, a minimum Galois Field size, or a minimum codeword length.

Figure 2:
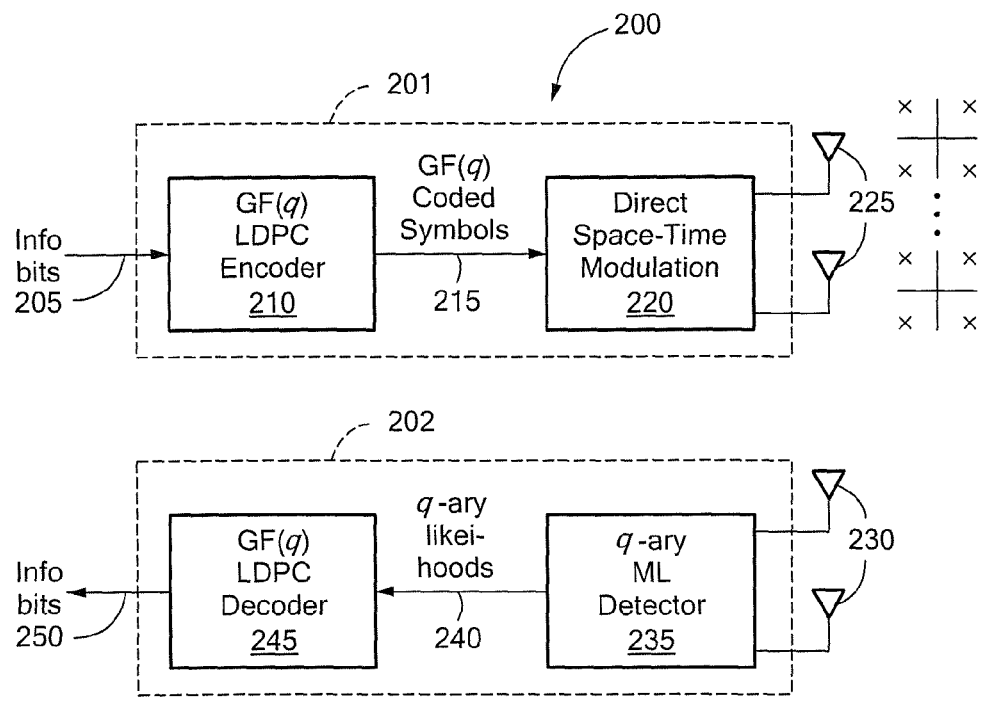
FIG. 2 is a block diagram of an example direct space-time modulator and demodulator which utilizes a low-density parity-check (LDPC) code with a nonbinary Galois-field of size q [GF(q)]

FIG. 2 illustrates a block diagram of an example direct space-time GF(q) LDPC modulator and demodulator system 200 (e.g., an expansion of system 100 above). In particular, the system 200 may comprise a transmitter 201 and receiver 202. The transmitter 201 receives information bits 205 at an encoder 210 (e.g., a GF(q) LDPC encoder). The encoder 210 may encode the information as described herein (e.g., with particular reference to FIG. 5), and the coded symbols 215 may be transmitted to a modulator 220, such as the direct space-time modulation component as shown. Accordingly the modulated signals may be transmitted from antennas 225.

Conversely, the receiver 202 may receive signals through antennas 230 at detector 235, such as a q-ary ML detector as shown. The q-ary likelihoods (signals 240) may then be relayed to a decoder 245 (e.g., GF(q) LDPC decoder) to generate decoded information bits 250, accordingly.

The LDPC codes described herein may be applied to MIMO systems using a known direct modulation approach (i.e. direct LDPC GF(q) modulation). In particular, known approaches have proposed a direct space-time non-binary Galois-field [GF(q)] LDPC modulation scheme for quasi-static channels of up to four transmit antennas. Also, it has been shown that for 2×2 and 4×4 MIMO channels under Rayleigh fading at moderate spectral efficiencies of 2 and $$\frac{8}{3}$$

b/s/Hz, the direct modulation approach performs within 0.5 dB of outage probability and 0.8 dB better than space-time bit-interleaved coded modulation with iterative detection (BICM-ID). Also, a direct space-time GF(256) LDPC modulation scheme outperformed binary LDPC-encoded bit-interleaved coded-modulation iterative detection (BICM-ID) schemes over a 2×2 fast-fading MIMO channel (similar results may be found for quasi-static channels provided for single receive antenna systems).

For direct LDPC GF(q), each LDPC code symbol over GF(q), $q=2^m$, is directly mapped to L space-time symbols, where L is a positive integer. The binary representation of each GF($2^m$) code symbol is partitioned into $L \cdot n_T$ sets of $$\frac{m}{L \cdot n_T}$$

tuples such that each set maps to a single-antenna constellation point using a Gray-mapping scheme. The mapped constellation points are then transmitted simultaneously from the $n_T$ transmit antennas over L space-time symbols. For example, one could map symbols from a GF(256) LDPC code to a four-transmit antenna system employing a QPSK constellation at each transmitter. Other modulation approaches can be considered. The coding techniques presented here are not limited to the direct modulation approach.

The receiver generates a set of likelihoods for each space-time symbol and passes this information to the GF(q) LDPC code decoder. Bayesian belief networks and graphical decoding techniques can be used to formulate decoders for LDPC codes and turbo codes. Some simplifications are possible, but in general the GF(q) decoding complexity per iteration grows as $\mathcal{O}(n_s q \log q)$. Those skilled in the art will understand the details regarding GF(q) LDPC decoding and reduced-complexity implementations, as well as details on the direct LDPC space-time modulation and coding, and the description herein is merely introductory.

The use of staircase LDPC GF(q) codes is next described.

While conventional LDPC GF(q) codes are defined by sparse parity check matrices, their corresponding generator matrices are generally not sparse and encoding thus requires a full matrix multiplication. Structured codes have been studied to decrease encoding complexity for binary LDPC codes.

To reduce the encoding complexity, a "staircase" parity-check matrix may be formed via concatenation of two matrices, [W|V], where W is a sparse n–k by k matrix while V is an n–k by n–k matrix, as described in FIG. 3.

As used herein, and as may be appreciated by those of ordinary skill in the art, a matrix is called "sparse" if most of its elements are equal to 0. In addition, also provided herein is the following definition of a "staircase matrix" as that term is used herein:

An m×l sparse matrix H is defined as a staircase matrix if H=[W|V], where W is a sparse m×h matrix while V is a sparse m×{h–l} matrix with structure described in FIG. 3. It should be noted that sparse matrix V contains two nonzero diagonals, whose coefficients $\{\alpha_i\}$ and $\{\beta_i\}$ are nonzero GF(q) elements. The extra nonzero element $\beta_1$ may be used to ensure that sparse matrix V is regular, i.e. constant row and column weights, but may be set to zero if needed.

Note also that the term "staircase LDPC code" may be used to describe a code whose parity check matrix is a staircase matrix (i.e. whose parity check matrix meets the above definition of a staircase matrix—H=[W|V]).

As shown in FIG. 3, a GF(q) LDPC staircase parity check matrix 300 can be written as the concatenation of two sub-matrices, H=[W|V], where W is a sparse submatrix and V is a sparse submatrix with two nonzero diagonals that resemble a staircase structure. The nonzero locations of W and V can be chosen to realize graphs with larger minimum cycle lengths, while the coefficients can be chosen to satisfy certain properties on the shorter cycles. Notably, the parity check matrix H is sparse to maintain good performance levels and reduce the coding complexity. Note further that W and V may also include elements from a non-binary field, as may be appreciated by those of ordinary skill in the art.

Referring now to FIG. 3A, if a codeword 306 has the form $[s_1, s_2, \ldots, s_k, p_1, \ldots, p_{n-k}]$ where $\{s_j\}$ are the systematic information symbols and $\{p_j\}$ are the parity symbols, then multiplying the parity check matrix 300 by the codeword symbols 306, as shown in FIG. 3A, results in equations (4-1) through (4-4) as shown below for the parity symbols. The equations derived from FIG. 3A can be solved using a variety of different techniques. However, by solving as shown below in connection with Equations 4-1 through 4-4, the equations can be solved sequentially which can be advantageous in systems which may, for example, otherwise require buffering. In addition, the number of computations per information symbol is low and this allows for efficient implementation.

$$P_1 = \sum_{j=1}^{k} \frac{w_{1,j}}{a_1} S_j + \frac{\beta_1}{\alpha_1} P_{n-k} = \tilde{p}_1 + \frac{\beta_1}{\alpha_1} P_n - k \quad (4\text{-}1)$$

$$P_2 \frac{\beta_2}{\alpha_2} P_1 + \sum_{j=1}^{k} \frac{w_{2,j}}{a_2} s_j = \tilde{P}_2 + \left(\prod_{l=1}^{2} \frac{\beta_1}{a_1}\right) P_n - k \quad (4\text{-}2)$$

$$\vdots$$

$$P_i = \frac{\beta_i}{\alpha_i} P_{i-1} + \sum_{j=1}^{k} \frac{w_{i,j}}{a_i} = \tilde{p}_i + \left(\prod_{l=1}^{i} \frac{\beta_1}{a_1}\right) P_{n-k} \quad (4\text{-}3)$$

$$\vdots$$

$$\frac{\beta_n - k}{\alpha_{n-k}} P_{n-k-1} + \sum_{j=1}^{k} \frac{w_n - k, j}{a_{n-k}} S_j = \hat{P}_{n-k} + \left(\prod_{l=1}^{n-k} \frac{\beta_1}{a_1}\right)_{P_{n-k}} \quad (4\text{-}4)$$

In the equations, $W_{i,j}$ is the element in the $i^{th}$ row and $j^{th}$ column of sparse random matrix W, and the "intermediate parity symbols"

$$\tilde{p}_0 = 0\tilde{p}_0 = 0 \text{ and } \tilde{p}_i = \frac{\beta_i}{\alpha_i} \tilde{p}_{i-1} + \sum_{j=1}^{k} \frac{w_{i,j}}{\alpha_i} s_j$$

for all $i \geq 1$. Note that these are the parity symbols if $\beta_1 = 0$.

Notably, intermediate parity symbol $\tilde{p}_2$ depends upon intermediate parity symbol $\tilde{p}_1$, and subsequently each intermediate parity symbol $\tilde{p}_i$ depends upon a previous parity symbol $\tilde{p}_{i-1}$. The result of the computation results in a generally small number of steps needed to compute parity symbols, particularly since the matrix H is sparse.

As will be described below in conjunction with FIG. 4, in accordance with the techniques described herein, determining parity symbols $\{\tilde{p}_i\}$ only requires two steps (which are described in FIG. 4): (1) compute a vector dot product between information symbols and a normalized row of the sparse matrix W and (2) pass the multiplication output to an accumulator to compute the intermediate parity symbols.

Figure 4:
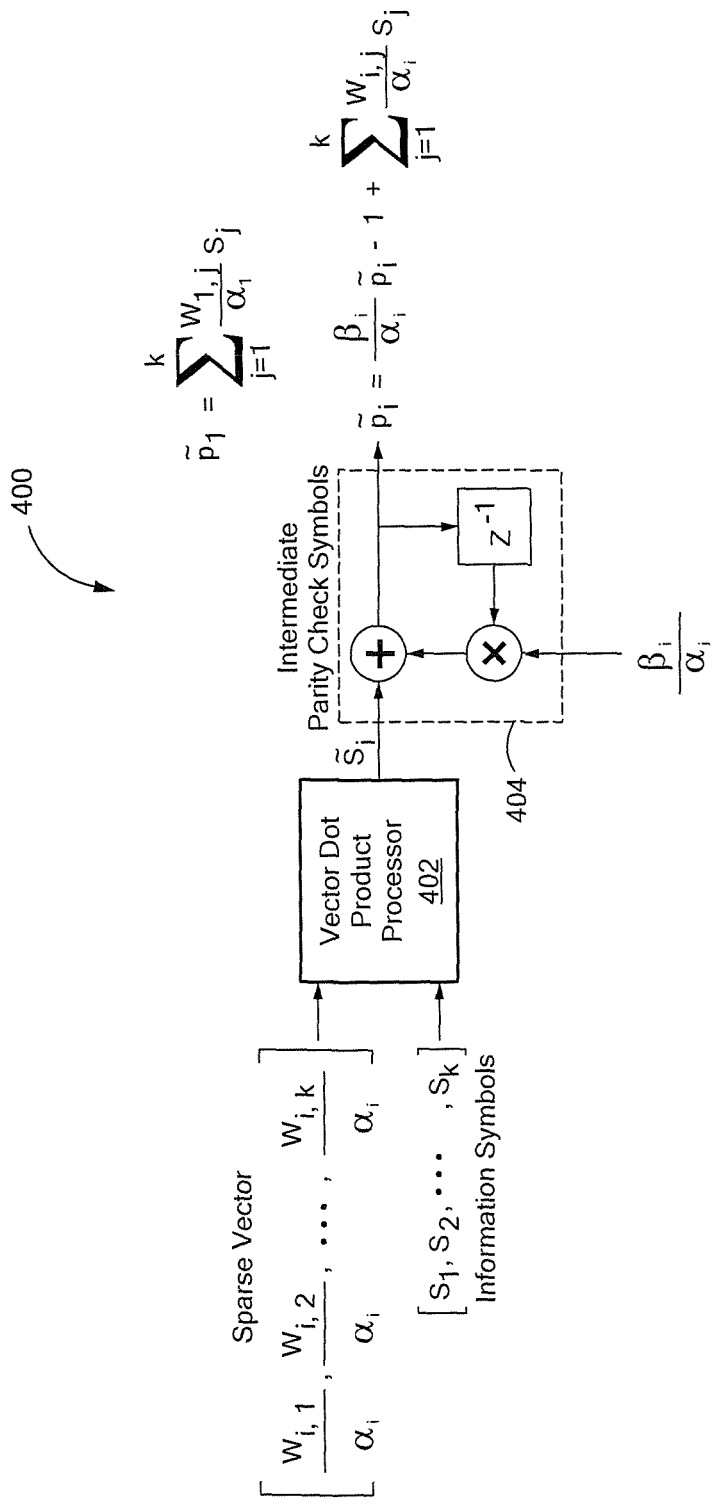
FIG. 4 is a block diagram of an exemplary accumulator implementation used within an encoder for staircase LDPC codes to compute intermediate parity symbols.

Referring now to FIG. 4, a portion of an encoder 400 includes a vector dot product processor 402 coupled to an accumulator 404. Vector dot product processor 402 receives a normalized row of the sparse matrix W denoted as [$W_{i,1}/\alpha_i$, $W_{i,2}/\alpha_i, \ldots W_{1,k}/\alpha_i$] and information symbols denoted as [$s_1$, $s_2, \ldots s_k$] and provides an output signal $\tilde{s}_i$ to an input of accumulator 404. Accumulator 404 receives the signals provided thereto from vector dot product processor 402 and provides intermediate parity symbols $\{\tilde{p}_i\}$ at an output thereof.

It should be appreciated that FIG. 4 illustrates an accumulator implementation, e.g., used within the encoder 210 of FIG. 2 for staircase LDPC codes to compute intermediate parity symbols and is an example of an implementation of Equations 4-1 to 4-4. These symbols are used to compute the final parity symbols in accordance with the below described technique. Notably, the complexity scales linearly with codeword length.

The intermediate parity symbols provided by accumulator 404 may then be used to determine the final parity symbols through the following technique. Specifically, given a staircase matrix, the following steps can be used to determine the parity symbols for encoding a codeword [$s_1, \ldots, s_k$] (sometimes referred to herein as "Technique 1"):

1) First, the accumulator 400 of FIG. 4 may be used to determine intermediate parity symbols $\tilde{p}_i, \ldots, \tilde{p}_{n-k}$, which correspond to the parity symbols if $\beta_1 = 0$.
2) Second, the final parity symbols $p_{n-k}$ may be determined through equation (6-1)

$$p_{n-k} = \frac{\tilde{p}_{n-k}}{1 + \prod_{l=1}^{n-k} \frac{\beta_l}{\alpha_l}} \quad (6\text{-}1)$$

where $\beta_l$ are off diagonals elements of a staircase matrix, and $\alpha_l$ are diagonal elements of the staircase matric.
3) Last, the remaining parity symbols for $1 \leq i \leq n-k-1$ can then be determined from equation (6-2):

$$p_i = \tilde{p}_i + p_{n-k} \prod_{l=1}^{i} \frac{\beta_l}{\alpha_l} \quad (6\text{-}2)$$

Note that the number of encoding operations increases linearly with respect to the codeword length, as the accumulator only requires a linear number of operations. Additionally, the denominator in the equation for the final parity symbols $P_{n-k}$ (i.e. Equation 6-1) must be nonzero, which is equivalent to equation (6-3):

$$\prod_{l=1}^{n-k} \beta_l \neq \prod_{l=1}^{n-k} \alpha_l \quad (6\text{-}3)$$

It can be said that a matrix has a valid staircase when the condition in equation (6-3) is satisfied.

For systems where encoding complexity is limited or where it is easier to only implement an accumulator, one can set $\beta_1 = 0$ so that only the first step in Technique 1 is needed for encoding.

Figure 6:
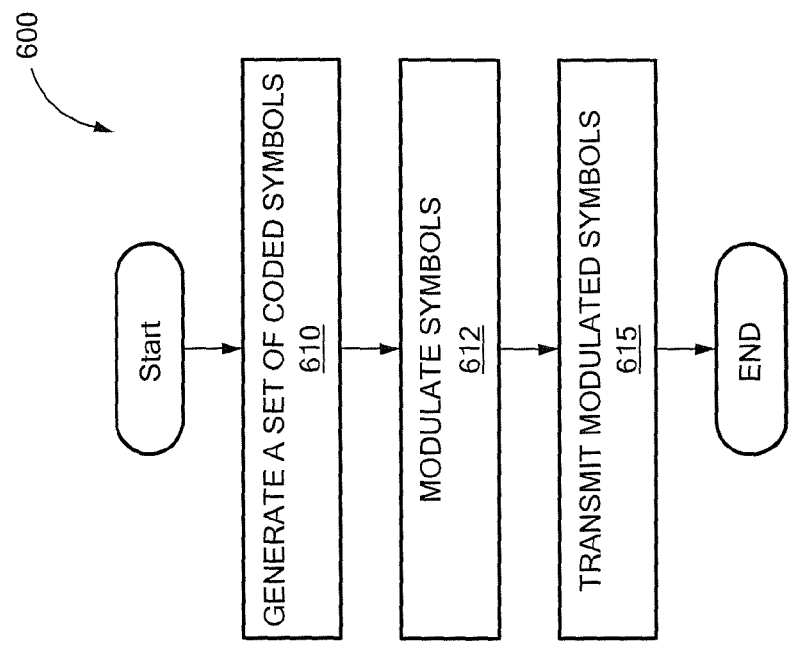
FIG. 6 is a flow diagram an exemplary procedure for transmitting modulated symbols.
Figure 5:
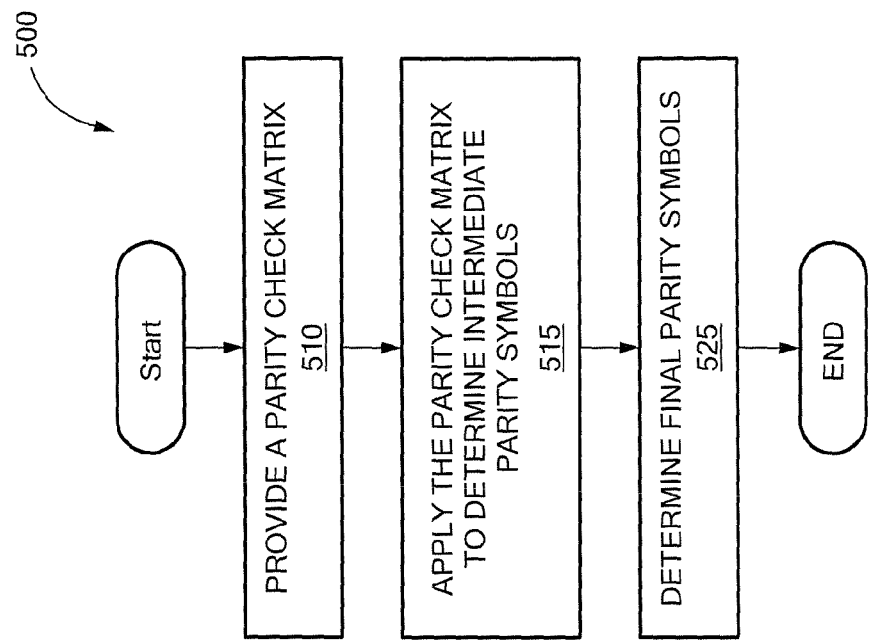
FIG. 5 is a flow diagram of an exemplary procedure for generating a set of parity symbols.

FIGS. 5 and 6 illustrate example processes according to the techniques described above.

FIG. 5 is a flowchart of an example process for generating a set of intermediate coded symbols according to one or more embodiments herein. A process 500 begins at processing block 510, where a parity check matrix H is provided which includes a first portion corresponding to a sparse matrix and a second portion corresponding to a staircase matrix.

In processing block 515, the parity check matrix H may be applied to a first set of k information symbols $s_1$-$s_k$ to generate intermediate parity symbols by forming a vector dot product between elements in a first row of the parity check matrix H and the first set of k information symbols $s_1$-$s_k$ and wherein the first intermediate value corresponds to a first intermediate parity check symbol $\tilde{p}_1$.

Illustratively, in processing block 515, remaining intermediate parity symbols $\{\tilde{p}_i\}$ may be determined by applying the parity check matrix H to a first set of information symbols to generate an intermediate value by forming a vector dot product between elements in a i th row of the parity check matrix and a first set of k information symbols $s_1$-$s_k$ and summing this result with a value corresponding to the product of the previous intermediate parity check symbol $\tilde{p}_{i-1}$ and a corresponding non-diagonal coefficient of the staircase portion of the parity check matrix.

In processing block 525, final parity symbols are determined from intermediate parity symbols as described in (6-1) and (6-2). In particular, the final parity symbol $p_{n-k}$ is first determined. Then this value to determine $p_i$ by summing the intermediate parity check symbol $\tilde{p}_i$ with a product of the $p_{n-k}$ and product of ratios of the diagonal coefficients and corresponding non-diagonal coefficients of the staircase portion of the parity check matrix.

FIG. 6 is a flowchart of an example procedure for transmitting information bits according to one or more embodiments herein. The process 600 begins at processing block 610, where a set of coded symbols may be generated via an encoder configured to receive the information bits and apply an LDPC code provided from a parity check matrix H which includes a first portion corresponding to a sparse matrix and a second portion corresponding to a staircase matrix to provide a set of coded symbols. In processing block 612 the symbols are modulated. In processing block 615, the set of modulated symbols may be transmitted.

For systems where encoding complexity is limited or where it is easier to only implement an accumulator, one can set $\beta_1=0$ so that only the first step in Technique 1 is needed for encoding.

Rate-compatible staircase LDPC GF(q) codes are next described. According to one or more of the embodiments herein, the staircase LDPC codes introduced above can be used to create rate-compatible LDPC codes which utilize a single encoder with low complexity.

It should be appreciated that in contrast to other rate-compatible schemes, the rate adaptive coding scheme described herein can maintain constant codeword (frame) length for different code rates and can thus be easily combined with other techniques including, but not limited to, orthogonal frequency division multiplexing (OFDM), which may require a constant codeword length. More generally, the technique can also be used generate variable-length codewords that vary in both the number of information symbols and/or the number of parity symbols.

The first case discussed herein is where the parity check matrix will have constant column weight for all rates. That is, the column weight doesn't vary as the rate changes. As such, the following definition for a parity check matrix having constant column weight for all rates is given:

According to embodiments herein, a rate compatible $\{\bar{k}, \rho_c\}$ primary matrix H is a staircase matrix (as defined above i.e., H=[W|V]), with dimensions $\rho_c \bar{k} \times (\bar{k}+\rho_c \bar{k})$ and column weight $\rho_c$. The left matrix W is a sparse matrix whose nonzero locations are chosen to satisfy the following properties:
1) W has dimensions $\rho_c \bar{k} \times \bar{k}$;
2) W has exactly one nonzero per row; and
3) W has exactly $\rho_c$ nonzeros per column.

Meanwhile, V has dimensions $\rho_c \bar{k} \times \rho_c \bar{k}$ with the staircase form depicted in FIG. 3. The nonzero coefficients of V satisfy equation (6-3A):

$$\prod_{l=1}^{\rho_c \bar{k}} \beta_l \neq \prod_{l=1}^{\rho_c \bar{k}} \alpha_l \quad (6\text{-}3A)$$

The nonzero locations of W and V can be chosen to meet some criteria. For example, they can be chosen to maximize the minimum cycle length in the Tanner Graph representation of H.

In one example, all nonzero elements of H may, though need not, be chosen randomly from nonzero elements in GF(q). Notably, a rate compatible primary matrix (given by the above definition for a parity check matrix having constant column weight for all rates) is a parity check matrix for a rate $$\frac{1}{1+\rho_c}$$

code with codeword length of $(\rho_c+1)\bar{k}$ symbols.

According to the techniques described herein, this single matrix can be used to encode different rates with negligible performance loss. In particular, according to "Technique 2" (also referred to herein as a single column weight technique), consider a system which requires n GF symbols per codeword length and a rate compatible $\{\bar{k}, \rho_c\}$ primary matrix H which satisfies the properties of a parity check matrix having constant column weight for all rates as defined above.

A staircase LDPC GF(q) encoder with rate $$\frac{k}{n},$$

for any integers k and n satisfying $1 \leq k \leq \bar{k}$ and $k+1 \leq n \leq \bar{k}+\rho_c \bar{k}$ can be realized as follows:

1) For every k information bits, construct a length-k information vector $s=[s_1, \ldots, s_k, 0, \ldots, 0]$ where the first k elements are the information symbols and the last $\bar{k}-k$ elements are zero. Although the zeros are shown here added to the end of the information vector, it should be understood that zeros may also be added at any position in the vector.
2) Encode s using the generator for parity H; the accumulator implementation of the generator was described above in equation (4-1). The result is a set of parity check symbols $[\tilde{p}_1 \cdots \tilde{p}_{\rho_c \bar{k}}]$.
3) Select n−k of the parity symbols, and append these to the k information symbols to form the codeword: $c=[s_1, \ldots, s_k, p_{a_1}, p_{a_2} \cdots p_{a_{n-k}}]$ The last step of Technique 2 involves the removal of parity symbols and is therefore called the "puncturing step." The decision of which parity symbols to be removed during this step will clearly affect the performance of the encoding process. It is described below how to effectively select sets of parity symbols to be removed based upon the parity check matrix.

Figure 7:
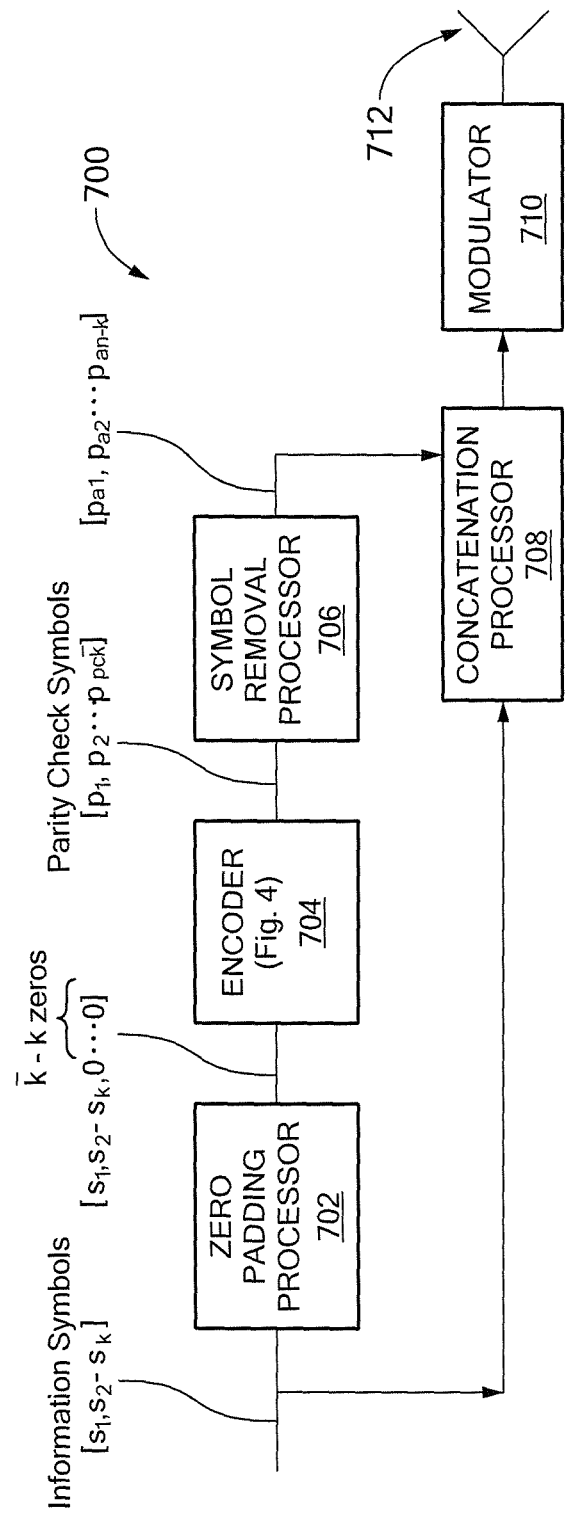
FIG. 7 is a block diagram of a portion of a transmitting system which utilizes an encoder with an accumulator implementation which is the same as or similar to that described in FIG. 4.

Referring now to FIG. 7, an encoding system which implements a technique which may be the same as or similar to the technique described above in conjunction with Technique 2 includes a padding processor 702 which receives information symbols $[s_1, s_2, \ldots, s_k]$ and adds thereto a number of zeros corresponding to $\bar{k}-k$. The zero padded information symbols are provided to an input of an encoder 704 which generates parity symbols using, for example, the technique described above in conjunction with FIG. 4 and provides the parity symbols to a symbol removal processor 706 which provides a predetermined set of parity symbols to a concatenation processor 708.

Determining which parity symbols to remove in symbol removal processor 706 can be selected using different approaches. One example approach is to determine the set of parity symbols to remove for the rate which uses the least number of parity symbols, i.e. the highest-rate. This set will be referred to as the puncturing superset. The set of parity symbols to remove for all lower rates, i.e. more parity symbols, can then be subsets of the puncturing superset.

Concatenation processor 708 also receives the information symbols and provides a concatenated signal to a modulator which modulates the signal provided thereto for transmission via an antenna 712.

It should be appreciated that to achieve different coding rates, the number of zeros added by padding processor 702 and the number of parity symbols to remove via the symbol removal processor 706 are varied, but the accumulator/encoding function performed by encoder 704 remains constant for all rates. Examples are provided to help illustrate how this technique can be used to achieve different rates.

In one example consider a rate compatible {4536,2} primary matrix H. For a fixed codeword length n, the coding rate $$\frac{k}{n},$$

where 1≤k≤4536 can be realized by using Technique 2 on any group of k information symbols in step 1 and by selecting n−k parity symbols in step 3. Thus the codeword length can be held constant while the coding rate changes.

In another example, consider again a rate compatible {4536,2} primary matrix H. For a fixed k satisfying 1≤k≤4536, any code rate $$\frac{k}{l+k},$$

where 1≤l≤9072, can be realized by using Technique 2 with k information symbols and by keeping l parity symbols. Thus the number of information symbols per codeword can be held constant while different coding rates are used.

Thus, from these examples it should be understood that Technique 2 can be used for encoding in systems that require a variable number of information and parity symbols. It can be applied in special cases where a system may require either constant codeword length or constant number of information symbols per codeword. The latter case is especially useful for systems that may want to encode offline but decide later, when channel conditions are determined, how many parity symbols to use, and may be combined with retransmission schemes that incrementally send more parity symbols until transmission success.

A key result of Technique 2 is "Theorem 1." The encoding described in Technique 2 with a primary matrix H=[W|V] is equivalent to the encoding obtained by using a staircase parity matrix $\tilde{H}=[\tilde{H}|\hat{\tilde{V}}]\tilde{H}=[\tilde{W}|\tilde{V}]$ of dimensions n×{k+n}. More specifically, let A={$a_1, \ldots, a_{n-k}$} be a subset of {$1, \ldots, \rho_c \bar{k}$} denoting the n−k parity symbols that are kept in the last step of Technique 2, and define $a_0=1$. Then the matrices H and I are related as shown in equations (8-1), (8-2), and (8-3) for each row i and column j of $\tilde{H}$:

$$\tilde{W}_{i,j} = \sum_{l=a_{i-1}+1}^{a_i} W_{i,j} \prod_{m=l}^{a_{i-1}} \frac{\beta_{m+1}}{a_m} 1 \leq j \leq k \qquad (8\text{-}1)$$

$$\tilde{\beta}_i = \alpha_{a_{i-1}} \prod_{l=a_{i-1}}^{a_i-1} \frac{\beta_{l+1}}{a_l} \qquad (8\text{-}2)$$

$$\tilde{a}_i = a_{a_i} \qquad (8\text{-}3)$$

The additions, multiplications, and divisions are all taken with respect to GF(q) arithmetic. Moreover, the new matrix coefficients satisfy equation (6-3B):

$$\prod_{l=1}^{\rho_c \bar{k}} \beta_l \neq \prod_{l=1}^{\rho_c \bar{k}} \alpha_l \qquad (6\text{-}3B)$$

and therefore the new matrix $\tilde{H}=[\tilde{H}|\hat{\tilde{V}}]$ has a valid staircase.

Theorem 1 indicates that a (larger) primary staircase matrix may be used to realize the same encoding obtained by (smaller) staircase matrices. By varying the number of parity symbols that are removed during the last step of Technique 2, different coding rates are achievable. The last part of the theorem states that regardless of which parity symbols are removed at the last step of Technique 2, the realized matrix has a valid staircase.

The set of parity symbols which are punctured determines the type of smaller staircase matrix which is realized. From Theorem 1, it can be seen that the submatrix comprised of the first k columns and rows {$a_{i-1}+1, \ldots, a_i$} of W essentially combined into row i of $\tilde{W}$. Each row of W is weighted by a function of the β and α values for those rows. From the above definition for a parity check matrix having constant column weight for all rates, it can be seen that W has exactly one nonzero per row. Thus, from equation (8-1) the i th row of $\tilde{W}$ will have at most $a_i-a_{i-1}$ nonzeros, which are in the same locations as the nonzeros of the rows in {$a_{i-1}+1, \ldots, a_i$} of W.

Figure 8:
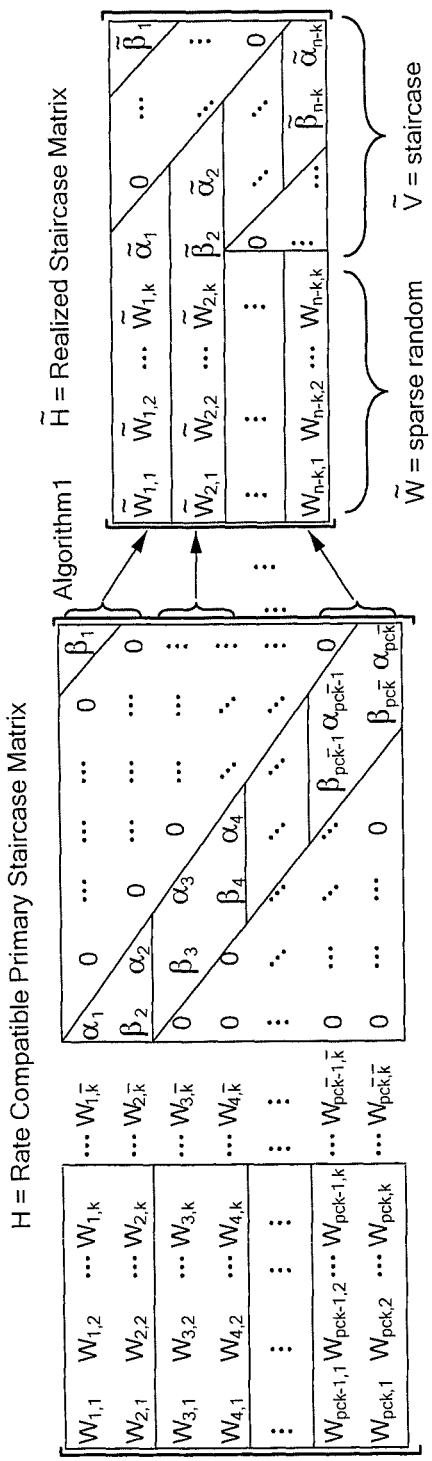
FIG. 8 illustrates an exemplary rate compatible primary staircase matrix and a realized staircase matrix.

FIG. 8 shows an example of how the primary staircase matrix and realized staircase matrix of Technique 2 are related (e.g., where by using Technique 2 on a primary staircase matrix H, smaller staircase parity matrices can be realized as described in Theorem 1). In this example, the first and third parity symbols are among those removed in the puncturing step of Technique 2; thus, the first two rows of H combine into the first row of $\tilde{H}$, the next two rows of H into the second row of $\tilde{H}$, etc. Note that only the first k columns and the values of α, β, are involved in the combination. Different sets of rows of H can be combined by changing the set of parity symbols which are punctured, resulting in different parity check matrix structures and code rates. Additionally, different columns of H can be removed by inserting zeros into different locations of the zero padding processor.

Thus, an important implication of Theorem 1 is that different staircase parity check matrices can be realized by using a single encoder based on a primary matrix.

The second case discussed herein is where the parity check matrix will have variable column weight. For instance, this technique may result in improved performance for the lower rate codes. According to this second case, the following definition is given to introduce the primary matrix to use for this case.

A rate compatible variable column weight {$\bar{k}, \rho_c$} primary matrix H is defined herein as a staircase matrix as defined above (i.e., H=[W|V]), with dimensions $\rho_c \bar{k} \times (\rho_c \bar{k} + \rho_c \bar{k})$ and capable of max column weight $\rho_c$. The left matrix W is a sparse matrix whose nonzero locations are randomly chosen to satisfy the following properties:

1) W has dimensions $\rho_c \bar{k} \times \rho_c \bar{k}$;
2) W has exactly one nonzero per row; and
3) W has exactly one nonzero per column.

Meanwhile, matrix V has dimensions $\rho_c \bar{k} \times \rho_c \bar{k}$ with the staircase form depicted in FIG. 3 and satisfies equation (6-3A). All nonzero elements of H are nonzero elements in GF(q). (Notably, the maximum column weight of a rate compatible variable column weight $\{\bar{k}, \rho_c\}$ primary matrix H given above is actually two (2), but as will be seen in using the following process, the matrix is capable of emulating codes with column weights up to $\rho_c$.)

According to "Technique 3" (Variable Column Weight): Consider a system which requires n GF symbols per codeword length and a rate compatible $\{\bar{k}, \rho_c\}$ variable column weight primary matrix H which satisfies the properties of a rate compatible variable column weight $\{\bar{k}, \rho_c\}$ primary matrix H as defined above. Consider any rate $$\frac{k}{n},$$

where integers k and n satisfying $1 \leq k \leq \bar{k}$ and $k+1 \leq n \leq \bar{k}+\rho_c\bar{k}$. Additionally, consider any column weight $\rho$, where $1 \leq \rho \leq \rho_c$ and $\rho$ can be written as $$\rho = m + \frac{z}{k}$$

and $0 \leq z < k$ so that m is the largest integer which is smaller than or equal to $\rho$.

A staircase LDPC GF(q) encoder with rate $$\frac{k}{n},$$

and column weight $\rho$ in W, can be realized as follows.

1) For every k information bits, construct a length-$\bar{k}$ information vector $\bar{s}=[s_1, \ldots, s_k, 0, \ldots, 0]$ where the first k elements are the information symbols and the last $\bar{k}-k$ elements are zero. If $z>0$, construct another length $\bar{k}$ information vector $\tilde{s}$ as follows. Take the vector $\bar{s}$, and set $k-z$ of the first k elements to be zero, to obtain $\tilde{s}=[0, s_j, 0, \ldots, s_k, 0, \ldots, 0]$.
2) Construct a vector s with length $\rho_c\bar{k}$ as follows. Let the first $m\bar{k}$ elements of s be the vector $\bar{s}$ repeated a total of m times. If $z>0$, append vector $\tilde{s}$ into the next $\bar{k}$ elements of s. Set the remaining elements of s to 0.
3) Encode s using the generator for parity H; the accumulator implementation of the generator was described above equation (4-1). The result is a set of parity check symbols $[p_1, \ldots, p_{\rho_c\bar{k}}]$.
4) Select n−k of the parity symbols, and append these to the k information symbols to form the codeword: $c=[s_1, \ldots, s_k, p_{a1}, p_{a2}, \ldots, p_{an_s-k}]$.

The decision of which parity symbols to be removed during this step will clearly affect the performance of the encoding process. Additionally, the decision of which k of the information symbols to keep in forming $\tilde{s}$ will clearly affect the performance of a given column weight.

The following theorem outlines the result about this process. Theorem 2: the encoding described in Technique 3 with a primary matrix $H=[W|V]$ is equivalent to the encoding obtained by using a staircase parity matrix $\tilde{H}=[\tilde{W}|\tilde{V}]$ of dimensions $n \times \{k+n\}$, where $\tilde{W}$ has an average column weight of $\rho$. More specifically, let $A=\{a_1, \ldots, a_{n-k}\}$ be a subset of $\{1, \ldots, \rho_c\bar{k}\}$ denoting the n−k parity symbols that are kept in the last step of Technique 2, and define $a_0=1$. Then the matrices H and $\tilde{H}$ are related as shown in equations (10-1), (10-2), and (10-3) for each row i and column j of $\tilde{H}$:

$$\tilde{W}_{i,j} = \sum_{l=a_{i-1}+1}^{a_i} \prod_{m=l}^{a_i-1} \frac{\beta_{m+1}}{a_m} \sum_{y=0}^{p_c-1} W_{l,j+y\bar{k}} I\{s_{j+y\bar{k}} \neq 0\}, \leq j \leq k \quad (10\text{-}1)$$

$$\tilde{\beta}_l = \alpha_{a_{i-1}} \prod_{l=a_{i-1}}^{a_i-1} \frac{\beta_{l+1}}{a_l} \quad (10\text{-}2)$$

$$\tilde{a}_i = a_{a_i} \quad (10\text{-}3)$$

The additions, multiplications, and divisions are all taken with respect to GF(q) arithmetic. The term $I\{s_j \neq 0\}$ is the indicator function which is 1 if the j th element of vector s (created in step 2 of Technique 3) is nonzero, otherwise it is equal to zero.

Moreover, the new matrix coefficients satisfy equation (6-3B) and therefore the new matrix $\tilde{H}$ has a valid staircase.

From equation (10-1), the following corollary to this theorem results for the column weight of $\tilde{H}$: Corollary 1: consider a matrix H satisfying the definition of a rate compatible variable column weight $\{\bar{k}, \rho_c\}$ primary matrix H as defined above with Technique 3. For the equivalent matrix $\tilde{H}=[\tilde{W}|\tilde{V}]$ as described by Theorem 2, the submatrix $\tilde{W}$ has an average column weight of $\rho$. Thus, it can be seen that Technique 3 can be used in conjunction with a matrix satisfying the definition of a rate compatible variable column weight $\{\bar{k}, \rho_c\}$ primary matrix H in order to encode using a matrix with an arbitrary column weight $1 \leq \rho \leq \tilde{p}_c$.

Figure 9:
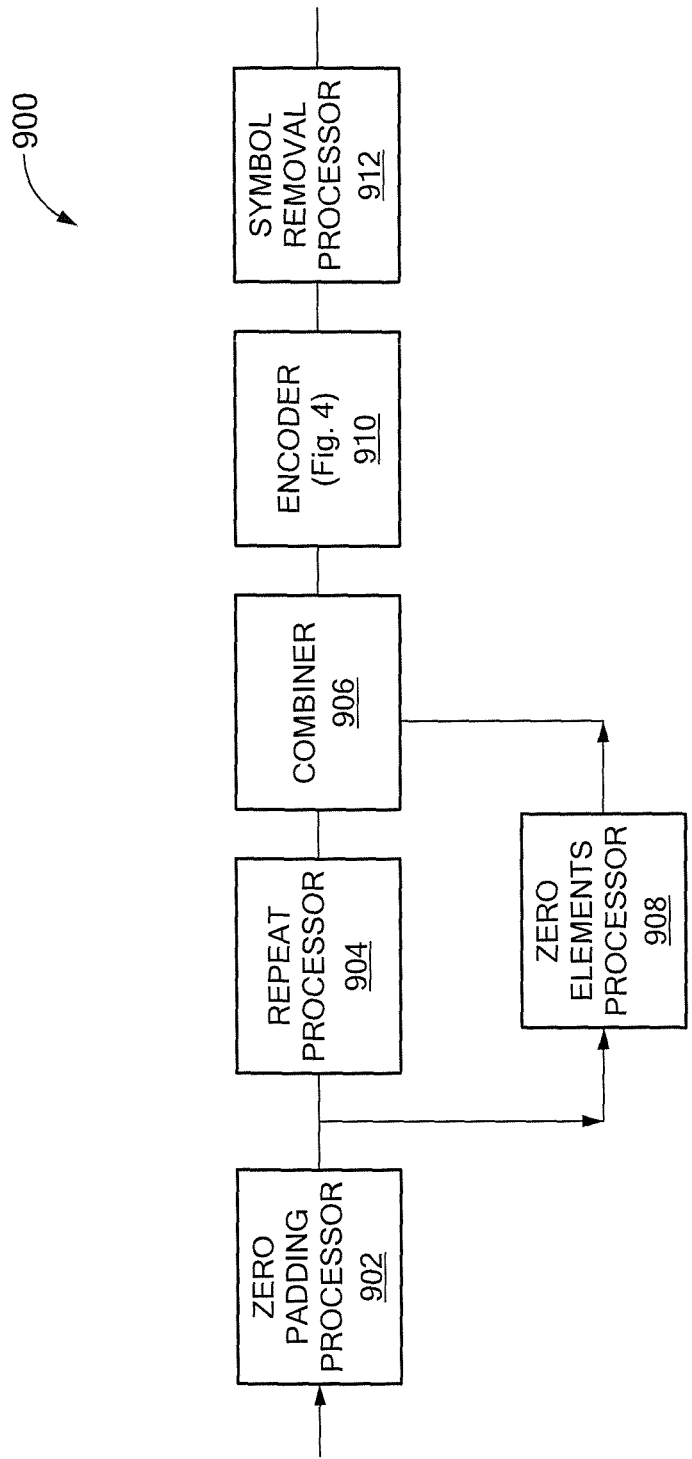
FIG. 9 is a block diagram of an exemplary system for generating a desired set of symbols.

Referring now to FIG. 9, an exemplary system 900 includes a padding processor 902 which receives information symbols $[s_1, s_2\text{-}s_k]$ and adds thereto a number of zeros corresponding to $\bar{k}-k$. The zeros can be added to arbitrary locations. For example, if zeros are appended after the information symbols, then the result is a set of symbols $\bar{s}=[s_1, s_2 \ldots, s_k, 0, \ldots 0]$. The zero padded information symbols $\bar{s}$ are provided to an input of repeat processor 904 which generates m copies of the zero padded information symbols $\bar{s}$. The m copies are needed so that the integer column weight of m can be achieved in the column weigh $$\rho = m + \frac{z}{k}.$$

The zero padded information symbols $\bar{s}$ are also provided to an input of a zero elements processor 908. The zero elements processor is needed to achieve the noninteger part of the column weight, $$\frac{z}{k}.$$

The m copies of the zero padded information symbols $\bar{s}$ and the symbols from the zero elements processor 908 are provided to a concatenation and padding processor 906. Concatenation and padding processor 906 provides a set of concatenated output symbols to an input of an encoder 910 The main purpose of this block is to combine the results of the repeat processor and zero elements processor in order to achieve the noninteger column weight $$\rho = m + \frac{z}{k}.$$

Encoder 910 generates parity symbols using, for example, a technique which may be the same as or similar to the technique described above in conjunction with FIG. 4. Encoder 910 provides the parity symbols to a symbol removal processor 912 which provides a predetermined set of parity symbols at an output thereof. These signals may then me be provided to a modulator and prepared for transmission.

System 900 implements Technique 3, which is used to achieve an arbitrary column weight $\rho$, where $1 \le \rho \le \rho_c$ and $\rho$ can be written as $$\rho = m + \frac{z}{k} \text{ and } 0 \le z < k$$

so that m is the largest integer which is smaller than or equal to p. Note the similarity to Technique 2, except that the output of padding processor 902 (i.e. the add zeros block) is further modified before being used in the accumulator.

A result on the distribution of the matrix coefficients is as follows: Theorem 2: Consider a primary staircase matrix H whose nonzero coefficients are independent random variables with uniform distribution over the nonzero elements in GF(q); that is, equation (12-1):

$$P(W_{i,j} = w \mid W_{i,j} \ne 0) = \tag{12-1}$$
$$P(\beta_i = w \mid \beta_i \ne 0) = P(\alpha_i = w \mid \alpha_i \ne 0)\frac{1}{q-1} \forall w \in 1,$$
$$\ldots, q \cdot \forall \ 1 \le i \le pc^{\tilde{k}}, 1 \le j \le \bar{k}.$$

Let $\tilde{H}=[\tilde{W}|\tilde{V}]$ denote the realized matrix from using Technique 2 on parity outputs of H, as described in Theorem 1. Then the nonzero coefficients of $\tilde{H}$ are also independent and uniformly distributed over the nonzero elements in GF(q); that is, equation (12-1) also holds for all $\tilde{W}_{i,j}, \tilde{\beta}_i, \tilde{\alpha}_i$.

Figure 10:
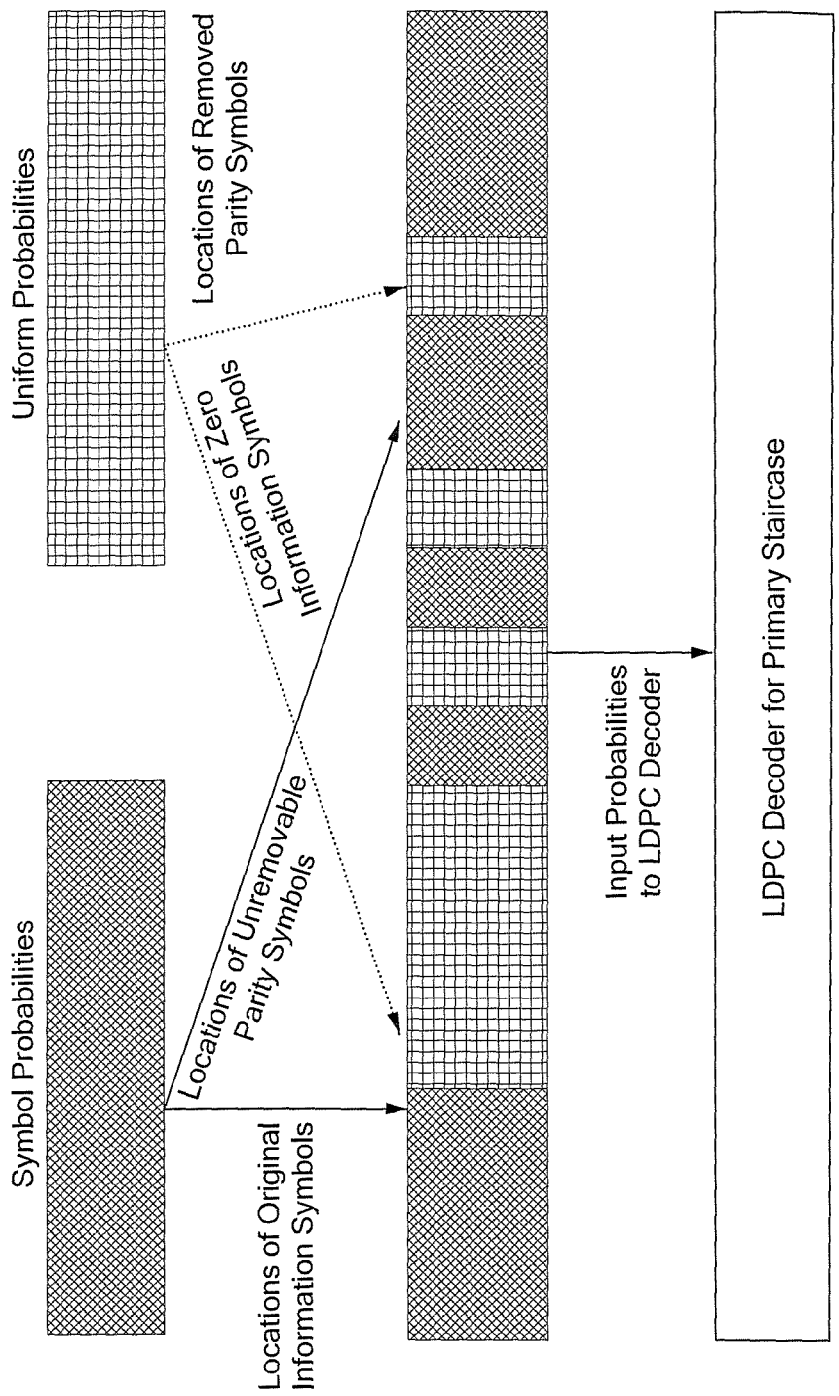
FIG. 10 is a block diagram of an exemplary rate adaptive receiving system.

Referring now to FIG. 10, one example decoding procedure for the rate adaptive staircase codes is to use a single parity check matrix for all rates. In the exemplary embodiment of FIG. 10, all probabilities are computed for all codeword symbols generated during an encoding process. As indicated by reference numerals 954 symbol probabilities 950 are inserted in locations 956, 958. As indicated by reference numeral 960, uniform probabilities 952 are inserted in locations 962 where zeros were inserted during a zero padding process (e.g. the zero padding process of FIG. 9). As indicated by reference numerals 964, uniform probabilities 952 are also inserted in the symbol removal locations 968 used by a symbol removal processor (e.g. the symbol removal processor of FIG. 9). Adding the symbol and uniform probabilities 950, 952 provides a resultant collection of probabilities 973. As indicated by reference numeral 974, the collection of probabilities 973 is provided as an input an LDPC decoder 976 using the primary staircase matrix of Techniques 2 or 3 described above.

Alternatively, a combination of row and column permutations can be applied to the primary staircase matrix of Techniques 2 or 3 in order to generate a new parity check matrix, referred to as the decoder matrix, which has properties that enable efficient decoding. The column permutations used to generate the decoder matrix can be applied to the collection of probabilities before they are added as an input to the decoder. The decoder can then use the decoder matrix.

Alternatively, another rate adaptive decoding approach is to use different parity check matrices for different coding rates. In this approach, the symbol probabilities are first computed. The probabilities are then input to an LDPC decoder which uses the parity check matrix $\tilde{H}=[\tilde{W}|\hat{V}]$ described in Theorem 1 for the given rate. Again, column and row permutations can be applied to the symbol probabilities and parity check matrices to enable efficient decoding.

Concerning puncturing patterns, as stated earlier, the last step of Technique 2 involves the removal of parity symbols. The decision of which parity symbols to be removed during this step will clearly affect the performance of the code. According to the embodiments herein, techniques are shown to effectively select sets of parity symbols to be removed based on the parity check matrix.

As described above, for large field sizes, matrices with random nonzero locations have strong performance. Furthermore, matrices with regular column weight of 2 and whose row weights take at most two values (semi-regular) have also been shown to perform well. Therefore, the techniques herein choose puncturing patterns that produce regular (or nearly regular) matrices.

A definition of semi-regular puncturing is now provided as follows. Consider a rate compatible $\{\bar{k}, \rho_c\}$ matrix H. Let $I_i^{(j)}$ denote the number of nonzeros in the first j columns of the i th row of H (from the definition of a rate compatible matrix, $I_i^{(j)}$ is either one or zero). For a rate $$\frac{k}{n}$$

code, let $A=\{a_1, \ldots, a_{n-k}\}$ be a subset of $\{1, \ldots, \rho_c\bar{k}\}$ denoting the n–k parity symbols that are kept in the last step of Technique 2. Let $$\bar{\rho}_r = \left\lceil \frac{\rho_c\bar{k}}{n-k} \right\rceil$$

and $m=(n-k)(\bar{\rho}_r+1)-\rho_c\bar{k}$. Then A is said to be semi-regular puncturing if it satisfies equation (13-1) of FIG. 13 for m of the n–k values of $a_l$, and equation (13-2) for the other n–k–m values:

$$\Sigma_{i=a_{l-1}}{}^{a_l} I_i^{(k)} = \bar{\rho}_r \tag{13-1}$$

$$\Sigma_{i=a_{l-1}}{}^{a_l} I_i^{(k)} = \bar{\rho}_r + 1 \tag{13-2}$$

From Theorem 1, it can be seen that using a semi-regular puncturing pattern induces a matrix with semi-regular row weights. Furthermore, the selection of A can be determined offline so that puncturing patterns can be easily selected for a given rate. As shown below, the performance of codes using these patterns is very strong.

As described earlier, one example approach is to determine the set of parity symbols to remove for the rate which uses the least number of parity symbols, i.e. the highest-rate. This set will be referred to as the puncturing superset. The set of parity symbols to remove for all lower rates, i.e. more parity symbols, can then be subsets of the puncturing superset. The primary staircase matrix can be constructed so that equations (13-1) and (13-2) are guaranteed to be satisfied over all rates while preserving the property that the puncturing vector for all lower rates are subsets of the puncturing superset.

An example matrix and superset puncturing vector is provided here. Consider a system which produces codewords of fixed length N, where N is an even number. Suppose the code supports rates up to ½, i.e. N/2 information symbols, and has a regular column weight of $\rho_c=2$. Due to the regular column weight, the rate adaptive encoding algorithm uses Technique 2. The primary matrix has dimensions N×2N. Consider the set of rows in the primary matrix. Suppose every pair of rows has a total of exactly one nonzero in the first N/4 columns. Furthermore, suppose every pair has a total of exactly one nonzero in the second group of N/4 columns, and every row has exactly one nonzero in the first N/2 columns. The rows also have the same property for the second group of N/2 columns. Then, it can be seen that by using a puncturing superset of [1, 3, ..., N−1], i.e. the odd elements of the parity symbols, then for all rates there is guaranteed to be a subset of this puncturing superset which satisfies (13-1) and (13-2). This example is only provided for illustrative purposes and can be applied to other matrix sizes, maximum data rates, different column weights $\rho_c$, and variable column weights in Technique 3.

The following is an example of how the rate compatible staircase matrix can be structured to obtain less complex puncturing patterns. Consider a system with $\rho_c=2$ that would like to support coding rates up to $$\frac{1}{2}.$$

The primary staircase matrix thus has dimensions n×n. In order to realize any $$\frac{k}{n}$$

rate, k parity symbols are to be removed at the end of Technique 1. Suppose the parity matrix is set up so that $$l_{2l-1}^{(\frac{n}{3})} = 0$$

for all l=1, 2, ..., $$\frac{n}{3};$$

that is, the first $$\frac{n}{3}$$

odd rows do not contain any nonzeros in the first $$\frac{n}{3}$$

columns. Then to realize any $$\frac{k}{n}$$

rate code, one can implement a semi-regular puncturing pattern of [1, 3, 5, ..., 2k−1]. As an example, a rate $$\frac{1}{3}$$

code has exactly one nonzero per row from removing the first $$\frac{n}{3}$$

odd parity symbols.

Clearly the matrix in this example has extra structure which results in simpler semi-regular puncturing patterns but can lead to degraded performance. Below, it is shown that the performance loss due to this structure is small.

For illustrative narrowband MIMO systems, the coupling between transmit and receive antennas can be modeled as equation (14-1):

$$\vec{z}_n \sqrt{\frac{\varsigma}{n_T}} \vec{V}_n \vec{x}_n + \vec{w}_n \qquad (14\text{-}1)$$

where n=1, 2, ..., $n_s$ (number of space-time symbols), $\vec{V}_n$ is the $n_R \times n_T$ (number of receive by number of transmit antennas) channel matrix containing the complex attenuation between each transmit and receive antenna (each attenuation modeled as i.i.d. complex circular Gaussian with unit variance) over the n th space-time symbol, $\vec{x}_n$ is an $n_T \times 1$ space-time symbol with unit energy elements, $\varsigma$ is the average total transmit energy for the nth space-time symbol, $\vec{z}_n$ is the $n_R \times 1$ complex receive-array output, and $\vec{w}_n$ is an $n_R \times 1$ vector containing temporally and spatially white zero-mean complex Gaussian noise, i.e., equation (14-2):

$$E[w_n w_n^\dagger] = I \qquad (14\text{-}2)$$

where $\vec{I}$ is the identity matrix, E[•] is the expectation operator and •† denotes the conjugate transpose. The term $\varsigma$ can be interpreted as the SNR (signal to noise ratio) per receive antenna for each space-time symbol.

Performance may also be examined over a block fading channel model, in which the channel varies (fades) periodically within a codeword. Under this model, the channel changes randomly between fades, and the length of each fade (block length) is assumed to be constant. The block length is a parameter that can be tuned to match different environments. Note that block lengths of 1 and $n_s$ correspond to the fast fading and flat fading (or quasi-static) channel models, respectively. The channel is known only by the receiver. Channel realizations are independent between different codewords. The frame-error-rate (FER) is the expected rate at which codewords are incorrectly decoded. In this case, outage probability serves as the lower bound on FER performance for infinitely long, isotropically transmitted codewords.

To compare the performances of the proposed space-time coding scheme to theoretical limits, the average total transmit energy over all space-time symbols is defined as ζ. Then the outage probability as a function of ζ is given by equation (14-3):

$$Pout(\varsigma) = P\left[\frac{1}{n_s}\sum_{k=1}^{n_s}\log_2\det\left(\vec{I} + \frac{S}{n_T}\vec{V}_k\vec{V}_k^\dagger\right) < R\right] \quad (14\text{-}3)$$

where R is the spectral efficiency (b/s/Hz) specified by the system parameters, and P[•] is the probability measure. Equation (14-3) was evaluated using Monte Carlo methods. The outage capacity is then the highest rate R such that (14-3) is less than a target error rate.

The outage capacity corresponding to the probability used in (14-3) is achieved by a Gaussian input maximizes mutual information between the MIMO channel input and output. These bounds are generally not achievable by input constrained systems that use a finite number of constellation points for signaling. Thus, the techniques herein also consider the outage probability of a system which employs PSK or QAM signaling. The outage probability for a system employing a constellation with Q equiprobable constellation points is given by equation (14-4):

$$P_{out}^{(Q)}(\varsigma) = \qquad (14\text{-}4)$$
$$P\left(\frac{1}{n_s}\sum_{k=1}^{n_s}E_{\vec{x}_k,\vec{w}_k}\left[\log_2\sum_{\vec{z}\in X}\exp\left(\left\|\vec{w}_k + \sqrt{\frac{S}{n_T}}\vec{V}_k(\vec{x}_k - \vec{z})\right\|^2\right)\right] < R\right)$$

where X is the set of constellation points and $E_{\vec{x}_k\vec{w}_k}[\cdot]$ denotes the expectation over the random noise $\vec{w}_k$ and transmitted constellation $\vec{z}_k$.

Using the metrics described in the previous section, presented herein are some results on the performance of the staircase LDPC codes for various rates. Performance may be studied over a block fading Rayleigh channel model, in which the channel varies (fades) periodically within a codeword. Under this model, the channel changes randomly between fades, and the length of each fade (block length) is assumed to be constant. The block length is a parameter that can be tuned to match different environments. Note that block lengths of I and $n_s$ correspond to the fast fading and flat fading (or quasi-static) channel models, respectively. The channel is known only by the receiver. Channel realizations are independent between different codewords.

Figure 11:
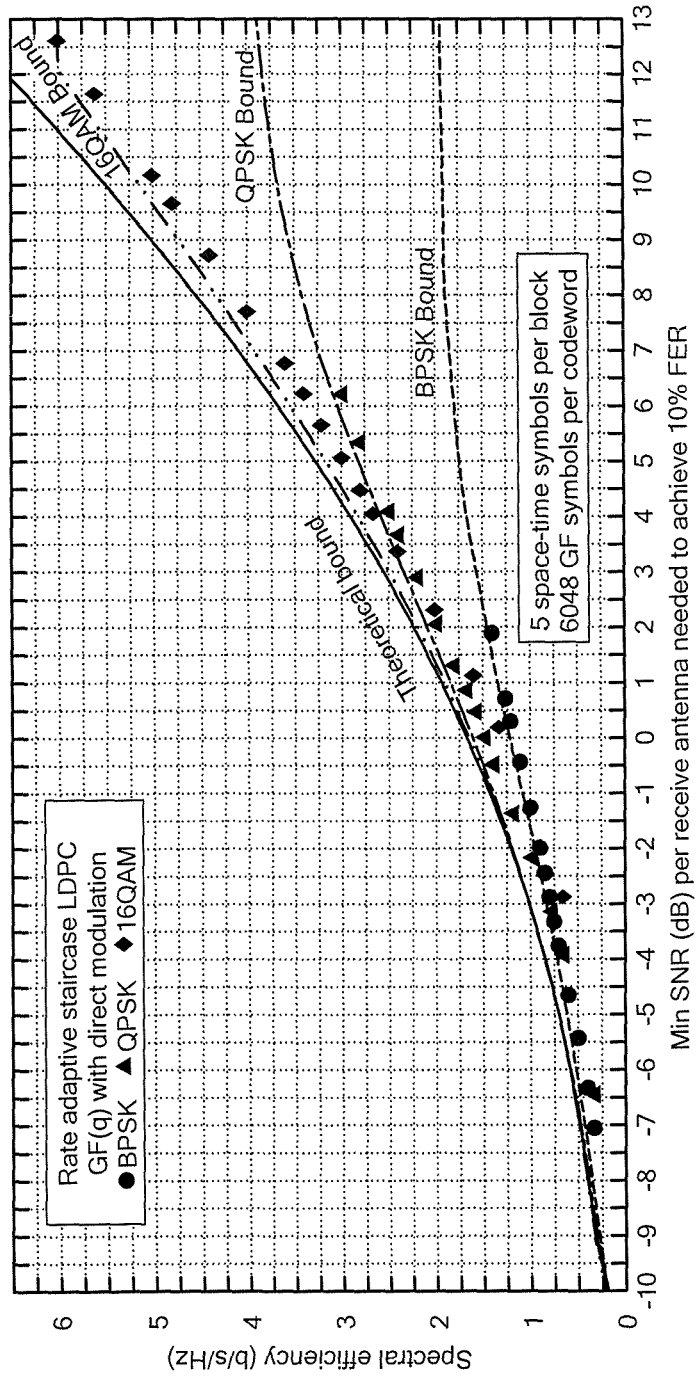
FIG. 11 is a plot of spectral efficiency (in b/s/Hz) vs. signal-to-noise ratio (in DB) per antenna needed to achieve 10% FER for a rate adaptive staircase LDPC with direct modulation. The system employs 2 transmit and 2 receive antennas (2×2).
Figure 12:
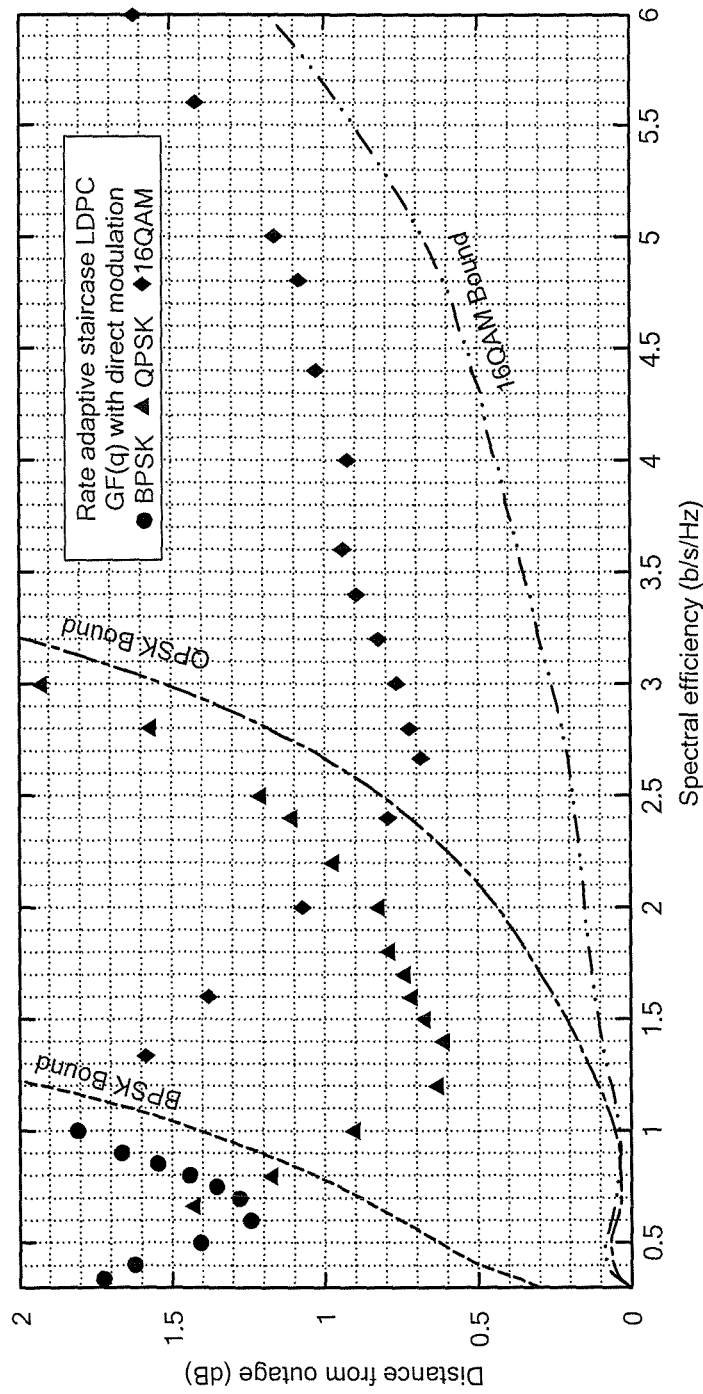
FIG. 12 is a plot of distance from outage (in dB) vs. spectral efficiency (in b/s/Hz) for a rate adaptive staircase LDPC with direct modulation in a 2×2 system.

Referring now to FIGS. 11 and 12, FIG. 11 is a plot of spectral efficiency (in b/s/Hz) vs. signal-to-noise ratio (in DB) per antenna needed to achieve 10% FER for a rate adaptive staircase LDPC with direct modulation and FIG. 12 is a plot of distance from outage (in dB) vs. spectral efficiency (in b/s/Hz) for a rate adaptive staircase LDPC with direct modulation. The system employs 2 transmit antennas and 2 receive antennas, i.e. 2×2.

FIGS. 11 and 12 illustrate performance of a rate adaptive LDPC GF(q) code for combinations of different coding rates and modulations under a block length of 5 space-time symbols. All coding rates in the FIGS. 10-11 are generated from a single parity matrix (encoder structure). The parity symbols are selected to generate a semi-regular pattern as defined above in conjunction with the definition of a rate compatible variable column weight {K, $\rho_c$} primary matrix H. The theoretical bound is determined from Equation 14-3 given above while the BPSK, QPSK, 16QAM input-constrained bounds are derived via monte carlo simulations from Equation 14-4. Note that at a given spectral efficiency, choosing the best combination of staircase coding rate and modulation results in a space-time code that performs within 0.3-0.4 dB of the input constrained achievable rate. Similarly, the best code performance is within 0.6-1.8 dB of the unconstrained capacity; as can be seen from FIG. 11, a significant portion of this gap is due to the constraint from the constellation.

Figure 13:
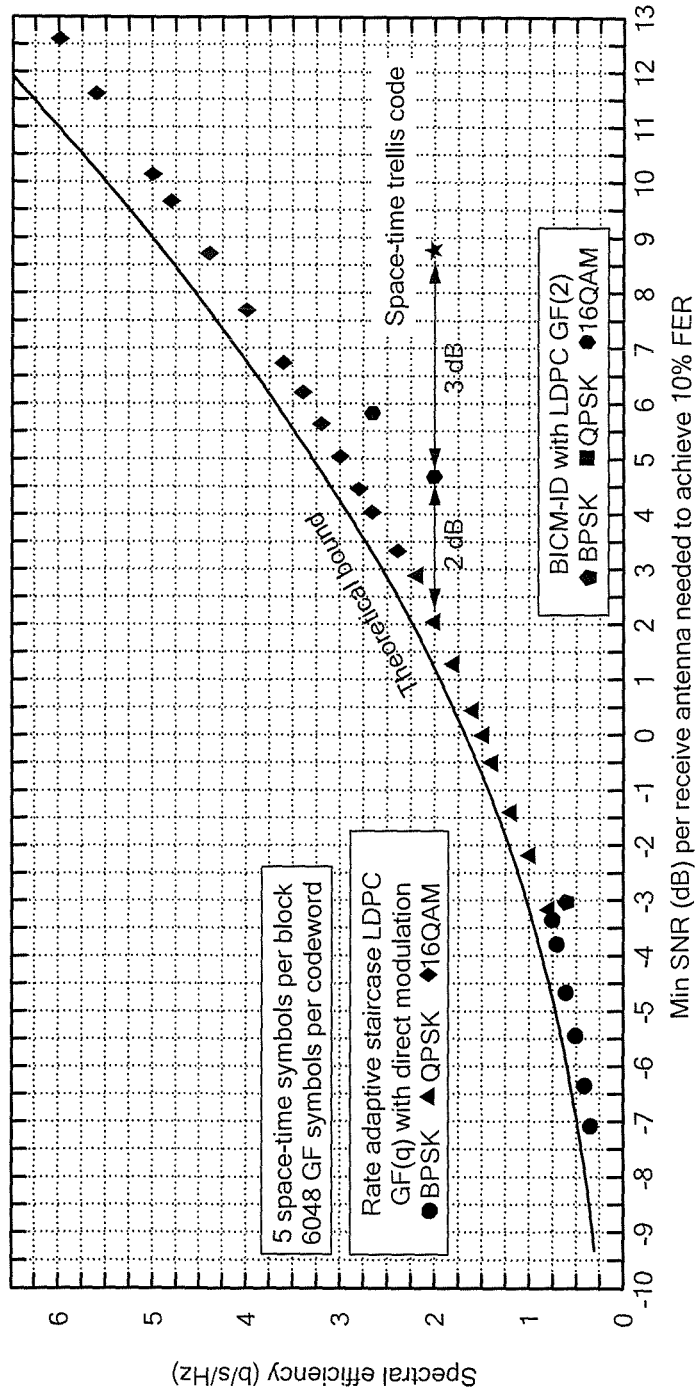
FIG. 13 is a plot of spectral efficiency (in b/s/Hz) vs. signal-to-noise ratio (in DB) per antenna needed to achieve 10% FER for a rate adaptive staircase LDPC with direct modulation compared to a space-time trellis code scheme. Both schemes use 4 transmit and 4 receive antennas (4×4). The block fading channel has 5 space-time symbols per block and 6048 GF symbols per codeword.

Referring now to FIG. 13, a plot of spectral efficiency (in b/s/Hz) vs. signal-to-noise ratio (in DB) per antenna needed to achieve 10% FER is shown. The plot of FIG. 13 compares the performance of a rate adaptive staircase LDPC with direct modulation to a space-time trellis coded system. The block fading channel has 5 space-time symbols per block and 6048 GF symbols per codeword. Systems for both codes employ 2 transmit and 2 receive antennas.

Under the same channel model as that used in FIGS. 11 and 12, FIG. 13 compares the performance of the rate adaptive LDPC GF(q) code with other space-time signaling schemes, space-time trellis codes (STTC), and bit-interleaved coded modulation with iterative detection (BICM-ID). STTC sacrifice some performance for lower decoding complexity. STTC simultaneously offer coding gain with spectral efficiency and full diversity over fading channels. Powerful space-time trellis codes for QPSK modulated schemes have been derived for different number of states, as may be appreciated by those skilled in the art.

Bit-interleaved coded modulation with iterative detection (BICM-ID) schemes utilize strong binary error-correcting codes, including low-density parity-check (LDPC) and turbo codes, for MIMO Rayleigh fast-fading channels and for quasi-static channels. Encoded bits are interleaved and mapped to space-time symbols. Due to the binary code, BICM-ID schemes must iteratively pass information between the demodulator and decoder to effectively separate the bits transmitted over multiple antennas on the same space-time symbol. As used herein, for optimal performance, full-complexity demapping schemes are considered. Lower complexity list-sphere decoding techniques trade performance with complexity.

As can be seen from the figure, under the block fading model, the performance of the rate adaptive code is about 5 dB better than the space-time trellis code for the same spectral efficiency (2 b/s/Hz); it is about 0.5-2.0 dB better than a BICM-ID scheme using a binary LDPC code.

Figure 14:
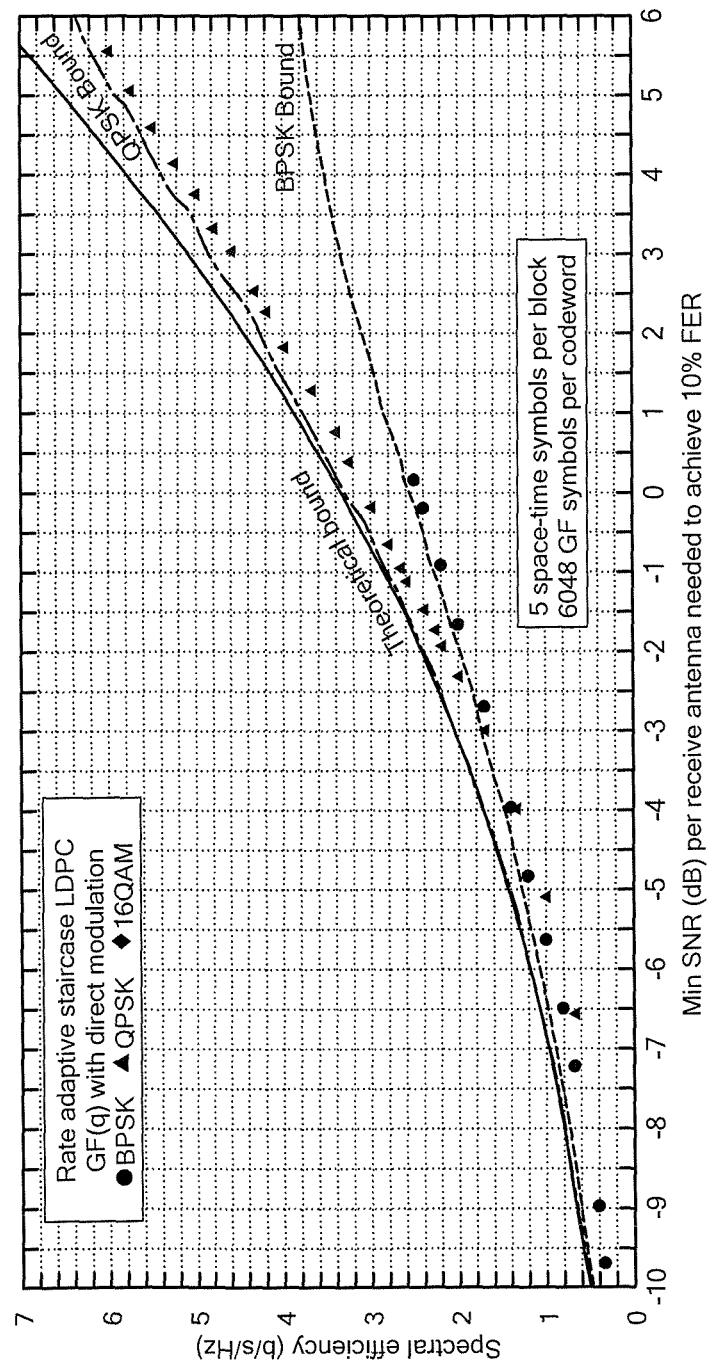
FIG. 14 is a plot of spectral efficiency (in b/s/Hz) vs. signal-to-noise ratio (in DB) per antenna needed to achieve 10% FER for a rate adaptive staircase LDPC with direct modulation for a 4×4 system under a channel having 5 space-time symbols per block and 6048 GF symbols per codeword.

Referring now to FIG. 14, a plot of spectral efficiency (in b/s/Hz) vs. signal-to-noise ratio (in DB) per antenna needed to achieve 10% FER is shown. As with FIG. 13, the plot is for a rate adaptive staircase LDPC with direct modulation for a system having 5 space-time symbols per block and 6048 GF symbols per codeword. The system employs 4 transmit antennas and 4 receive antennas, i.e. 4×4.

FIG. 14 illustrates the performance of the same rate adaptive code as in FIGS. 11-13 over a 4×4 block fading channel. Similarly to the 2×2 results, for this 4×4 channel the code performs within a dB of the BPSK and QPSK bounds for moderate spectral efficiencies. Performance of the rate adaptive code using a 16QAM constellation is not depicted because the direct modulation approach would require an LDPC code defined over GF($2^{16}$), but the decoder for such a code would be computationally prohibitive. The rate adaptive GF(256) code could be combined with a bit interleaved 16QAM modulation approach using known methods if higher spectral efficiencies are needed. Note that all coding rates are generated from the same primary staircase matrix (single encoder structure).

Figure 15:
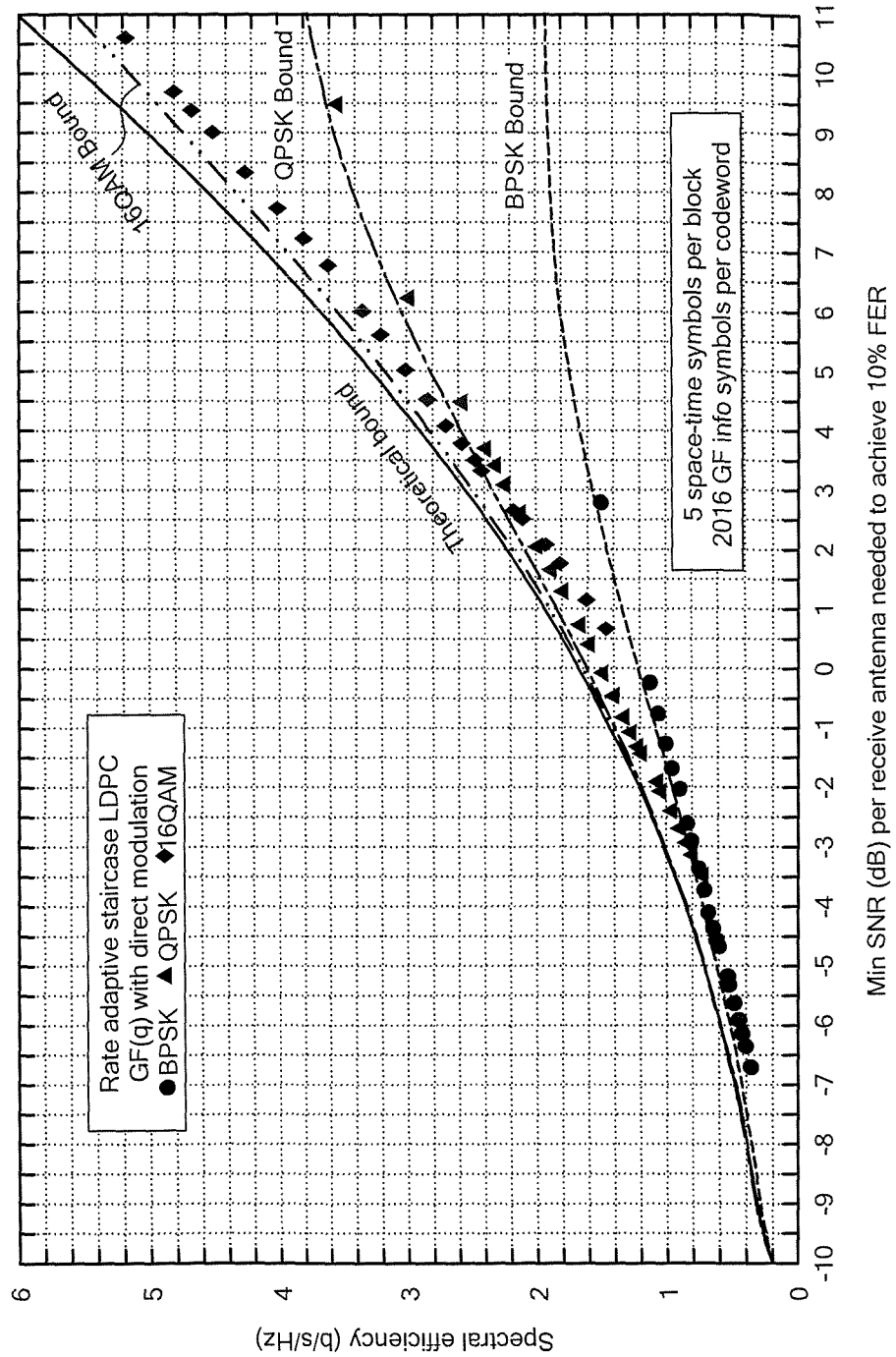
FIG. 15 is a plot of spectral efficiency (in b/s/Hz) vs. signal-to-noise ratio (in DB) per antenna needed to achieve 10% FER for a rate adaptive staircase LDPC with direct modulation for a 2×2 system having 5 space-time symbols per block and 6048 GF symbols per codeword.

The aforementioned results all generally utilize a fixed codeword length (6048 GF symbols). As mentioned earlier, the rate adaptive scheme can also produce codewords of different lengths. Therefore, FIG. 15 examines the performance of the code over multiple codeword lengths but keeping the number of information symbols constant. It can be seen that the performance of the code is still close to the theoretical bounds for different rates. In particular, performance of the rate adaptive LDPC code under a 2×2 block fading channel for different combinations of modulation and coding rates, using a fixed number of information symbols (2016) per codeword. Note that all coding rates are generated from the same primary staircase matrix (single encoder structure).

Figure 16:
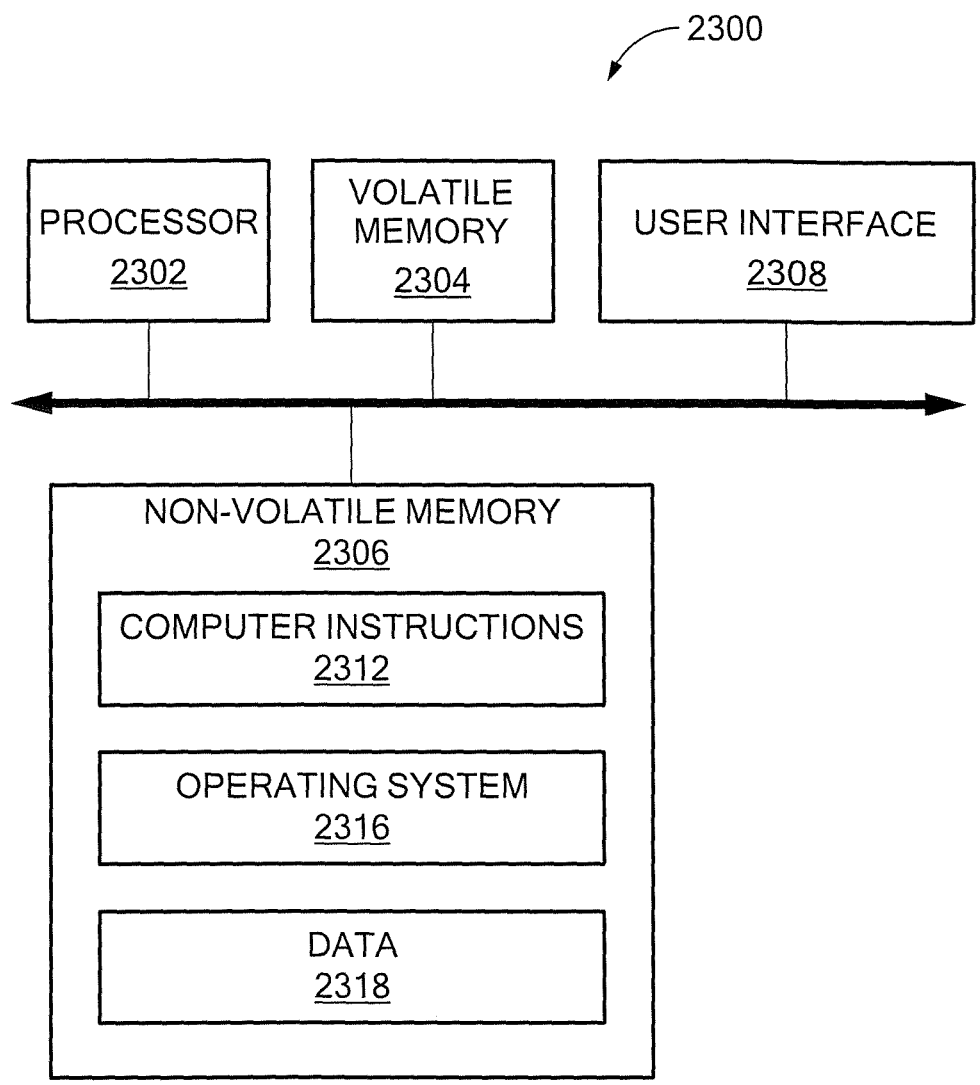
FIG. 16 is a block diagram of an example processing system on which the techniques described herein may be implemented.

Referring to FIG. 16, a computer 2300 includes a processor 2302, a volatile memory 2304, a non-volatile memory 2306 (e.g., hard disk) and a user interface (UI) 2308 (e.g., a mouse, a keyboard, a display, touch screen and so forth). The non-volatile memory 2306 stores computer instructions 2312, an operating system 2316 and data 2318. In one example, the computer instructions 2312 are executed by the processor 2302 out of volatile memory 2304 to perform all or part of the processes described herein (e.g., processes 500 and 600).

The processes described herein (e.g., processes 500 and 600) are not limited to use with the hardware and software of FIG. 16; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium includes but is not limited to a hard drive, compact disc, flash memory, volatile memory, magnetic diskette and so forth but does not include a transitory signal per se.

The processes described herein are not limited to the specific examples described. For example, the processes described herein (e.g., processes 500 and 600) are not limited to the specific processing order of FIGS. 5 and 6. Rather, any of the processing blocks of FIGS. 5 and 6 may be re-ordered, combined or removed, performed in parallel or in serial, as necessary, to achieve the results set forth above. The processing blocks in FIGS. 5 and 6 associated with implementing the system may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

A rate-adaptive low density parity check (LDPC) coding scheme defined over higher order Galois fields (GF) which uses a single low complexity encoding structure, but maintains strong performance at arbitrary rational rates, is described. The number of information symbols and codeword length were both varied to achieve different rates. The complexity of the encoder scales linearly with the codeword length. The single encoder structure enables a system implementation which can easily adapt its data rate to different channel conditions while still achieving near Shannon limits at arbitrary rational coding rates. It was shown that the rate adaptive encoder can be combined with a direct modulation approach to produce a strong space-time coding scheme for multiple-input multiple-output (MIMO) communication systems. The resulting space-time code achieves near capacity performance at various rates for different MIMO system configurations under flat fading and block fading channels.

The techniques described herein are not limited to the specific embodiments described. Elements of different embodiments described herein may be combined to form other embodiments not specifically set forth above. Other embodiments not specifically described herein are also within the scope of the following claims.

What is claimed is:

1. A method to generate a set of coded symbols, the method comprising:
   providing a nonbinary parity check matrix H comprising a first portion corresponding to a sparse matrix and a second portion corresponding to a nonbinary staircase matrix;
   applying the nonbinary parity check matrix H to a first set of k information symbols $s_1$-$s_k$ to generate an intermediate value by forming a vector dot product between elements in a first row of the nonbinary parity check matrix H and a first set of k information symbols $s_1$-$s_k$, wherein the first intermediate value corresponds to a first intermediate parity check symbol $\tilde{p}_1$; and
   determining a second intermediate parity check symbol $\tilde{p}_2$ by:
      applying the nonbinary parity check matrix H to a first set of information symbols to generate an intermediate value by forming a vector dot product between elements in a second row of the nonbinary parity check matrix H and a first set of k information symbols $s_1$-$s_k$; and
      summing this result with a value corresponding to the product of the first intermediate parity check symbol $\tilde{p}_1$ and a corresponding non-diagonal coefficient of the staircase portion of the nonbinary parity check matrix H.

2. The method of claim 1, further comprising:
   determining remaining intermediate parity symbols $\tilde{p}_i$ by applying the nonbinary parity check matrix H to a first set of information symbols to generate a corresponding intermediate value by forming a vector dot product between elements in a i th row of the nonbinary parity check matrix and a first set of k information symbols $s_1$-$s_k$ and summing this intermediate value with a value corresponding to the product of the previous intermediate parity check symbol $\tilde{p}_{i-1}$ and a corresponding non-diagonal coefficient of the staircase portion of the nonbinary parity check matrix.

3. The method of claim 1, wherein summing a value corresponding to the product of the first intermediate parity check symbol $p_1$ and a corresponding non-diagonal coefficient of the staircase portion of the nonbinary parity check matrix H comprises summing a value corresponding to the product of the first intermediate parity check symbol $p_1$ and a corresponding ratio between the non-diagonal coefficient and a diagonal coefficient of the staircase portion of the nonbinary parity check matrix H.

4. The method of claim 1, wherein the nonbinary staircase matrix contains two non-zero diagonals.

5. The method of claim 1, wherein the nonbinary staircase matrix contains an extra nonzero element $\beta_1$, wherein $\beta_1$ is positioned in the upper right-hand corner of the non-binary staircase matrix.

6. A method of computing parity values in an encoder, the method comprising:
   determining a plurality of intermediate parity symbols $\tilde{p}_1 \rightarrow \tilde{p}_{n-k}$;
   determining in the encoder a final parity check value $p_{n-k}$ by multiplying the intermediate parity symbol $\tilde{p}_{n-k}$ by a value computed in the encoder from nonbinary parity check matrix coefficients of a staircase portion of a nonbinary parity check matrix having a sparse portion and a staircase portion wherein the value corresponds to a ratio of the off-diagonal coefficient to the diagonal coefficient of the staircase portion of the nonbinary parity check matrix; and
   determining remaining parity symbols by computing in the encoder a sum of the intermediate parity symbols $\tilde{p}_i$ and a value computed as the product of the final parity check value and the ratio of the off-diagonal coefficients to the diagonal coefficients.

7. A method of computing parity values in an encoder, the method comprising:
   providing a nonbinary parity check matrix H in the encoder which includes a first portion corresponding to a sparse matrix and a second portion corresponding to a nonbinary staircase matrix; and
   applying the nonbinary parity check matrix H in the encoder to a set of k information symbols $s_1$-$s_k$ to generate a first parity check symbol $p_1$.

8. The method of claim 7, further comprising:
   determining remaining parity symbols $p_i$ by:
      applying the nonbinary parity check matrix H in the encoder to the set of information symbols to generate a corresponding intermediate value by forming a vector dot product between elements in a i th row of the nonbinary parity check matrix and a first set of k information symbols $s_1$-$s_k$; and
      summing this result in the encoder with a value corresponding to the product of the previous parity check symbol $p_{i-1}$ and a corresponding non-diagonal coefficient of the nonbinary staircase portion of the nonbinary parity check matrix.

9. The method of claim 8 wherein when the value of the last element in the first row of the staircase matrix $\beta_1$ portion of the nonbinary parity check matrix H is equal to zero, the intermediate values correspond to final values.

10. The method of claim 7, wherein the sparse matrix portion of the nonbinary parity check matrix H corresponds to a left hand portion of the nonbinary parity check matrix H and the staircase matrix portion of the nonbinary parity check matrix H corresponds to a right hand portion of the nonbinary parity check matrix H.

11. A system for transmitting information bits, the system comprising:
   a transmitter comprising a low density parity check (LDPC) encoder configured to receive information bits and to apply an LDPC code provided from a nonbinary parity check matrix H which includes a first portion corresponding to a sparse matrix and a second portion corresponding to a nonbinary staircase matrix to provide a set of coded symbols.

12. The system of claim 11, further comprising:
   a modulator coupled to receive coded symbols from the encoder and to provide modulated coded symbols for transmission via one or more antenna.

13. The system of claim 11, wherein the modulator is provided as a space-time modulator coupled to receive coded symbols from the encoder and to provide space-time modulated coded symbols for transmission via a plurality of antenna.

14. A method for transmitting information bits, the method comprising:
   generating a set of coded symbols via an encoder configured to receive the information bits and apply an LDPC code provided from a nonbinary parity check matrix H which includes a first portion corresponding to a sparse matrix and a second portion corresponding to a nonbinary staircase matrix to provide a set of coded symbols; and
   transmitting the set of coded symbols.

15. A rate adaptive nonbinary LDPC coding system comprising:
   a symbol insertion processor configured to receive a first plurality of information symbols and for inserting zeros within the first plurality of information symbols to provide second plurality of information symbols
   an encoder for receiving the second plurality of information symbols and for applying a parity check matrix H to the second plurality check symbol P, wherein the parity check matrix H includes a first portion corresponding to a spare matrix and a second portion corresponding to a nonbinary staircase matrix;
   a symbol removal processor for receiving the parity check symbols for said encoder and for removing a subset of the parity symbols to provide a selected subset of parity symbols.

16. The system of claim 15 further comprising:
   a combiner to provide a combined set of symbols comprising the subset of parity symbols and the information symbols; and
   a modulator configured to accept the combined set of symbols and to provide a modulated output signal for transmission.

17. The system of claim 16 wherein the combiner is a concatenation processor.

18. The system of claim 16 wherein the symbol removal processor removes a subset of parity symbols to provide a desired rate.

19. The system of claim 18 wherein the set of parity symbols to remove for the rate which uses the least number of parity symbols corresponds to a puncturing superset and wherein sets of parity symbols to remove for all lower rates are subsets of the puncturing superset.

20. The system of claim 16 wherein the staircase matrix can be constructed such that equations $$\sum_{i=\alpha_{j-1}}^{\alpha_j} I_i^{(k)} = \bar{\rho}_r$$

$$\sum_{i=\alpha_{j-1}}^{\alpha_j} I_i^{(k)} = \bar{\rho}_r + 1$$

are guaranteed to be satisfied over all rates while preserving the property that the puncturing vector for all lower rates are subsets of the puncturing superset.

21. A decoding procedure for a rate adaptive staircase code, the decoding procedure comprising:
   using a single parity check matrix for all rates;
   computing all probabilities for all codeword symbols generated during a rate adaptive staircase encoding process;
   inserting uniform probabilities in locations where zeros were inserted during a zero padding process;
   inserting uniform probabilities in symbol removal locations used by a symbol removal processor wherein inserting the uniform probabilities provides a resultant collection of probabilities;
   adding the collection of probabilities as an input to an LDPC decoder using a staircase matrix which uses the single parity check matrix.

22. The decoding procedure of claim 21 wherein the primary staircase matrix of the encoder operates in accordance with a single column rate technique.

23. The decoding procedure of claim 22 wherein the single column rate technique comprises:
   1) for every k information bits, constructing a length-$\bar{k}$ information vector $s=[s_1, \ldots, s_k, 0, \ldots, 0]$ where the first k elements are the information symbols and the last $\bar{k}-k$ elements are zero;
   2) encoding the information vector s using a generator for parity H to provide a set of parity check symbols $[p_1 \ldots p_{p,\bar{k}}]$;
   3) selecting n−k of the parity symbols; and
   4) appending the selected parity symbols to the k information symbols to form a codeword $c=[s_1, \ldots, s_k, p_{a_1}, p_{a_2} \cdots p_{a_{n-k}}]$.

24. The decoding procedure of claim 22 wherein the primary staircase matrix operates in accordance with a variable column weight technique.

25. A decoding procedure for a rate adaptive staircase code, the decoding procedure comprising:
   using different parity check matrices for different coding rates;
   computing symbol probabilities; and
   providing the symbol probabilities to an input of an LDPC decoder which uses different parity check matrices for different coding rates.

26. The decoding procedure of claim 25 wherein at least one of the parity check matrix $\tilde{H}$ is defined as $\tilde{H}=[\tilde{W}|\hat{V}]$ for a given rate wherein $\tilde{W}$ corresponds to a sparse matrix and $\hat{V}$ corresponds to a stair case matrix.

* * * * *